US010608119B2

(12) United States Patent
Nakamura et al.

(10) Patent No.: US 10,608,119 B2
(45) Date of Patent: Mar. 31, 2020

(54) METHOD OF MANUFACTURING FILM USING ALIGNMENT MATERIAL

(71) Applicant: FUJIFILM Corporation, Tokyo (JP)

(72) Inventors: Seigo Nakamura, Kanagawa (JP); Yoshiki Maehara, Kanagawa (JP); Yuichiro Itai, Kanagawa (JP); Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/114,610

(22) Filed: Aug. 28, 2018

(65) Prior Publication Data

US 2018/0366590 A1    Dec. 20, 2018

Related U.S. Application Data

(63) Continuation of application No. PCT/JP2017/007229, filed on Feb. 24, 2017.

(30) Foreign Application Priority Data

Mar. 30, 2016 (JP) ................................ 2016-069446

(51) Int. Cl.
*H01L 29/08* (2006.01)
*H01L 29/786* (2006.01)
(Continued)

(52) U.S. Cl.
CPC ...... *H01L 29/78696* (2013.01); *H01L 29/786* (2013.01); *H01L 29/78603* (2013.01);
(Continued)

(58) Field of Classification Search
USPC ......................................................... 257/40
See application file for complete search history.

(56) References Cited

U.S. PATENT DOCUMENTS 10,205,094 B2* 2/2019 Takeya ................ H01L 51/0003
2007/0243658 A1* 10/2007 Hirai .................... H01L 51/0004
438/99
(Continued)

FOREIGN PATENT DOCUMENTS

WO    2014/175351 A1    10/2014
WO    2015/133312 A1    9/2015

OTHER PUBLICATIONS

International Search Report issued in PCT/JP2017/007229; dated May 23, 2017; with English Translation.
(Continued)

*Primary Examiner* — Caleb E Henry
(74) *Attorney, Agent, or Firm* — Studebaker & Brackett PC

(57) ABSTRACT

Provided is a method of manufacturing a film, including: a manufacturing step of forming a film by performing movement, in a state in which a blade surface of a coating blade disposed to be spaced so as to face a substrate surface of a substrate is in contact with a solution for forming a film which is provided between the blade surface and the substrate surface, in a first direction in a plane parallel to the substrate surface, in which the solution is stored in a liquid reservoir between the blade surface and the substrate surface, and at least a portion of an outer peripheral end portion of the coating blade which is in contact with the solution is tilted with respect to the first direction in a plane parallel to the substrate surface. Accordingly, a method of manufacturing a film for forming a high quality film with high productivity is provided.

9 Claims, 13 Drawing Sheets

(51) Int. Cl.
*H01L 51/00* (2006.01)
*H01L 51/05* (2006.01)

(52) U.S. Cl.
CPC .... *H01L 29/78645* (2013.01); *H01L 51/0003* (2013.01); *H01L 51/05* (2013.01); *H01L 51/0545* (2013.01)

(56) References Cited

U.S. PATENT DOCUMENTS

| | | | |
|---|---|---|---|
| 2008/0138927 A1* | 6/2008 | Headrick | C30B 7/005 438/97 |
| 2012/0193618 A1* | 8/2012 | Takeya | H01L 51/0004 257/40 |
| 2016/0104842 A1 | 4/2016 | Takeya et al. | |
| 2016/0336512 A1 | 11/2016 | Takahashi et al. | |

OTHER PUBLICATIONS

Written Opinion issued in PCT/JP2017/007229; dated May 23, 2017; with English Translation.

Gaurav Giri et al., "Tuning charge transport in solution—sheared organic semiconductors using lattice strain", Letter, Nature, Dec. 2011, p. 504, vol. 480, Macmillan Publishers Limited.

An Office Action; "Notification of Reasons for Refusal," dated by the Japanese Patent Office on Jul. 9, 2019, which corresponds to Japanese Patent Application No. 2018-508799 and is related to U.S. Appl. No. 16/114,610; with English language translation.

Extended European Search Report issued by the European Patent Office dated Jan. 17, 2019, which corresponds to EP17773943.0-1211 and is related to U.S. Appl. No. 16/114,610.

Semi Lee et al., "Analysis of Slot Coating Flow Under Tilted Die", AIChE Journal, vol. 61, No. 5, Feb. 25, 2015, pp. 1745-1758.

\* cited by examiner

METHOD OF MANUFACTURING FILM USING ALIGNMENT MATERIAL

CROSS-REFERENCE TO RELATED APPLICATIONS

This application is a Continuation of PCT International Application No. PCT/JP2017/007229 filed on Feb. 24, 2017, which claims priority under 35 U.S.C. § 119(a) to Japanese Patent Application No. 2016-069446 filed on Mar. 30, 2016. The above application is hereby expressly incorporated by reference, in its entirety, into the present application.

BACKGROUND OF THE INVENTION

1. Field of the Invention

The present invention relates to a method of manufacturing a film by a coating method, and particularly relates to a method of manufacturing a film by using an organic semiconductor material, a crystal material, an alignment material, and the like.

2. Description of the Related Art

At present, an organic semiconductor is expected as a semiconductor material used for a flexible device and the like. The organic semiconductor may be formed by low-temperature coating compared with an inorganic semiconductor such as silicon. Various methods of manufacturing an organic semiconductor film using an organic semiconductor are suggested.

In the method of manufacturing an organic semiconductor thin film of WO2014/175351A, a raw material solution obtained by dissolving an organic semiconductor material in a solvent is supplied to a substrate, and the solvent is evaporated so as to precipitate crystals of the organic semiconductor material, such that an organic semiconductor thin film is formed on the substrate. An end surface-forming member having a contact surface on one side thereof is used, and the end surface-forming member is disposed so as to face the surface of the substrate so that the contact surfaces thereof intersect with the surface of the substrate at a fixed angle, a liquid droplet of a raw material solution that is in contact with the contact surface is formed by supplying the raw material solution on the substrate, the substrate and the end surface-forming member are relatively moved in a direction parallel to the surface of the substrate and in a direction in which the end surface-forming member is spaced from the liquid droplet, and the solvent in the liquid droplet is evaporated while the raw material solution is supplied such that the fluctuation in the sizes of the liquid droplets accompanied by the relative movement is maintained in a predetermined range, such that an organic semiconductor thin film is formed on the substrate after the contact surface is moved.

In "Tuning charge transport in solution-sheared organic semiconductors using lattice strain, Nature, 480 (2011) 504", the only surface before evaporation is exposed, and the shear plate draws the solution throughout the heated substrate during a solution shear process while most of the solution is maintained between the plate and the substrate, so as to form an organic semiconductor film.

SUMMARY OF THE INVENTION

WO2014/175351A discloses a manufacturing method for continuously forming an organic semiconductor film by coating, but the organic semiconductor film may be cut during the manufacturing, such that continuous forming may not be performed and the film quality of the formed organic semiconductor film may be deteriorated. The coating speed was slow, and the productivity of the organic semiconductor film was low.

In "Tuning charge transport in solution-sheared organic semiconductors using lattice strain, Nature, 480 (2011) 504", the distance between the substrate and the shear plate is as wide as 100 µm, and satisfactory film quality is hardly obtained. The coating speed was slow, and the productivity of the organic semiconductor film was low.

The coating method has an advantage in that manufacturing cost was low compared with the vacuum film forming method. In order to take the advantages of the coating method with respect to the vacuum film forming method, it is essential to increase the film formation speed, but a sufficient film formation speed is not obtained in practice.

An object of the present invention is to solve the above problems based on the related art and to provide a method of manufacturing a film by which a high quality film is formed with high productivity.

In order to achieve the above purpose, the present invention provides a method of manufacturing a film, comprising: a manufacturing step of forming a film by performing movement, in a state in which a blade surface of a coating blade disposed to be spaced so as to face a substrate surface of a substrate is in contact with a solution for forming a film which is provided between the blade surface and the substrate surface, in a first direction in a plane parallel to the substrate surface, in which the solution is stored in a liquid reservoir between the blade surface and the substrate surface, and at least a portion of an outer peripheral end portion of the coating blade which is in contact with the solution is tilted with respect to the first direction in a plane parallel to the substrate surface.

It is preferable that the coating blade includes a plurality of tilted portions tilted with respect to the first direction in the plane parallel to the substrate surface, and in the manufacturing step of forming a film, the film is formed by the tilted portion having a minimum tilt angle among the plurality of tilted portions. It is preferable that a tilt angle of at least the tilted portion having a minimum tilt angle among the plurality of tilted portions is 45° or less.

It is preferable that, in the manufacturing step of forming a film, the solution is continuously supplied to a portion between the blade surface and the substrate surface.

It is preferable that the solution is a solution including a material having aligning properties, and a rectangular blade member that is parallel to the plane parallel to the substrate surface and that has a side elongating in a second direction orthogonal to the first direction is moved in the first direction, and thus an alignment direction of an alignment film formed with the solution and an alignment direction of the film formed with the solution are different from each other.

It is preferable that, in a region in which the blade surface is in contact with the solution, a minimum distance between the blade surface and the substrate surface is 100 µm or less.

It is preferable that a surface of the coating blade is tilted with respect to at least one direction of the first direction, a second direction that is parallel to the plane parallel to the substrate surface and is orthogonal to the first direction, or a third direction that is orthogonal to the plane parallel to the substrate surface and the first direction.

It is preferable that a moving speed of the blade surface of the coating blade is 50 mm/min or faster.

It is preferable that the manufacturing step of forming a film by disposing the plurality of the coating blades in a second direction parallel to the plane parallel to the substrate surface and orthogonal to the first direction is performed.

It is preferable that the manufacturing step of forming a film by disposing the plurality of the coating blades in a second direction parallel to the plane parallel to the substrate surface and orthogonal to the first direction, and supplying different solutions for each of the coating blades to the plurality of the coating blades is performed.

It is preferable that the solution including a material having aligning properties is a solution including a material for forming a crystal or a solution including an organic semiconductor.

According to the present invention, it is possible to form a high quality film with high productivity.

DESCRIPTION OF THE PREFERRED EMBODIMENTS

Hereinafter, a method of manufacturing a film of the present invention is specifically described based on preferred embodiments provided in the accompanying drawings.

The expression "to" indicating in the numerical range described below includes numerical values described on both sides. For example, in the expression "$\varepsilon$ is a numerical value $\varepsilon1$ to a numerical value $\varepsilon2$", the range of $\varepsilon$ is a range including the numerical value $\varepsilon1$ and the numerical value $\varepsilon2$, and means $\varepsilon1 \leq \varepsilon \leq \varepsilon2$, represented by mathematical symbols.

Angles such as an "angle represented by concrete numerical values", "parallel", "perpendicular", and "orthogonal" include error ranges generally accepted in the corresponding technical field, unless described otherwise.

Figure 1:
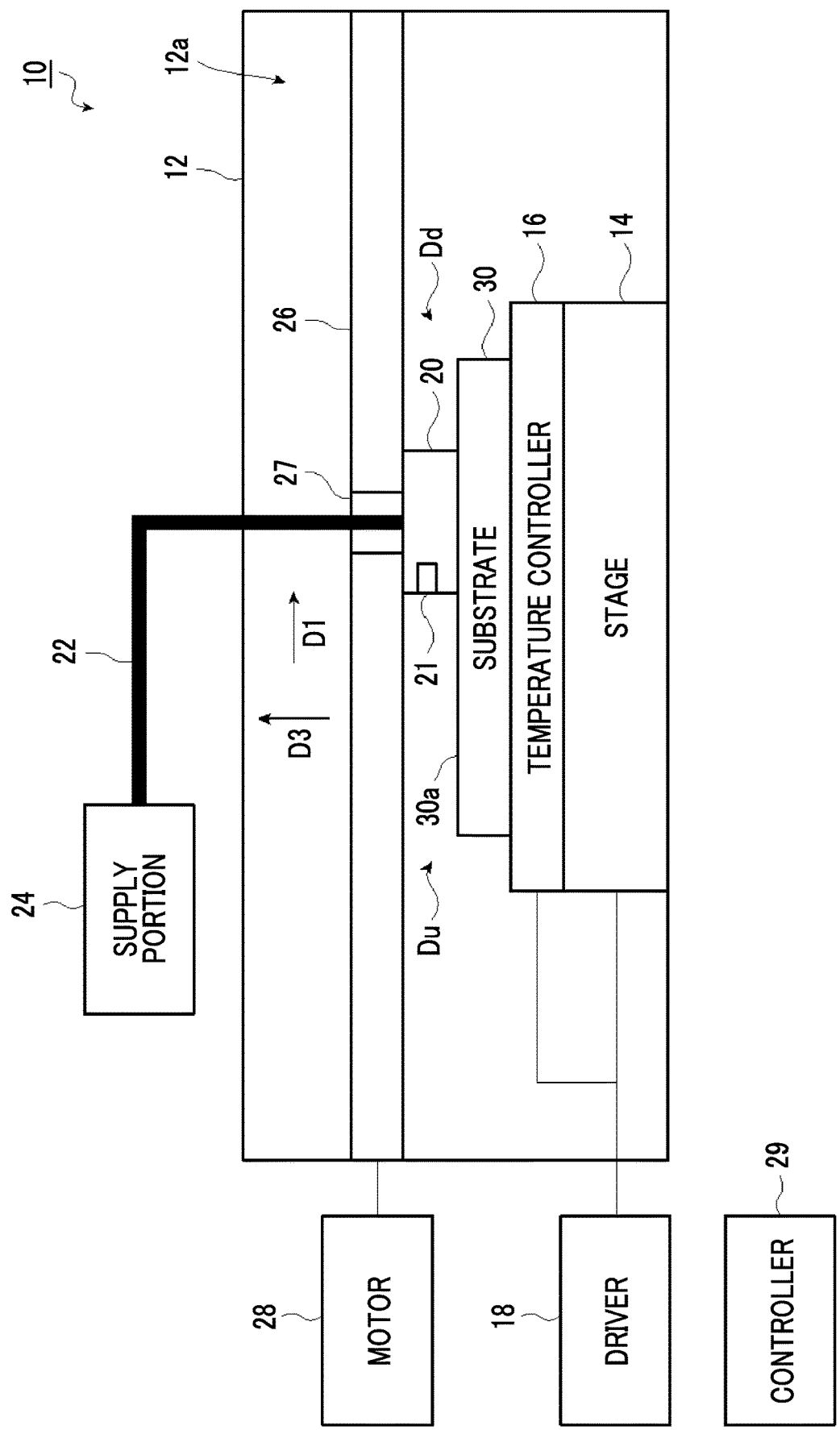
FIG. 1 is a schematic view illustrating an example of a manufacturing device used in a method of manufacturing a film of an embodiment of the present invention.

FIG. 1 is a schematic view illustrating an example of a manufacturing device used in a method of manufacturing a film of an embodiment of the present invention.

A manufacturing device 10 illustrated in FIG. 1 is used in a method of manufacturing a film 38 (see FIG. 5) in which an organic semiconductor material, a crystal material, an alignment material, and the like are used.

In the manufacturing device 10, a stage 14, a temperature controller 16 disposed on the stage 14, a coating head 20, and a guide rail 26 that moves the coating head 20 in a first direction D1 and a direction opposite to the first direction D1 are provided in an inside portion 12*a* of a casing 12.

The stage 14 and the temperature controller 16 are connected to a driver 18, and the movement of a substrate 30 described below by the stage 14 and the temperature of the substrate 30 described below by the temperature controller 16 are controlled by the driver 18. The coating head 20 is connected to a supply portion 24 via a supply pipe 22.

The guide rail 26 is connected to a motor 28, and the coating head 20 is moved in the first direction D1 and the direction opposite to the first direction D1 by the motor 28.

The driver 18, the supply portion 24, and the motor 28 are connected to a controller 29, and the driver 18, the supply portion 24, and the motor 28 are controlled by the controller 29.

The first direction D1 and the direction opposite to the first direction D1 are directions parallel to the surface of the stage 14. Since the substrate 30 is disposed on the stage 14 such that a substrate surface 30*a* of the substrate 30 and the surface of the stage 14 are parallel to each other, the first direction D1 is a direction defined by the plane P (see FIG. 10) parallel to the substrate surface 30*a* of the substrate 30.

On the stage 14, the temperature controller 16 is disposed, and the substrate 30 is further disposed, such that the substrate 30 may be moved in the first direction D1 and a direction opposite to the first direction D1. The stage 14 is parallel to the plane P (see FIG. 10) which is parallel to the substrate surface 30*a* of the substrate 30 and is moved in a second direction D2 (see FIG. 10) orthogonal to the first direction D1. The stage 14 moves the substrate 30 in a direction opposite to the second direction D2.

The configuration of the stage 14 is not particularly limited, as long as the substrate 30 is moved in the first direction D1, a direction opposite thereto, the second direction D2, and a direction opposite thereto. The stage 14 may have a configuration of moving in a third direction D3 orthogonal to the plane P (see FIG. 10) parallel to the substrate surface 30*a* of the substrate 30 and the first direction D1.

The temperature controller 16 sets the temperature of the substrate 30 to a predetermined temperature and maintains the temperature. The configuration of the temperature controller 16 is not particularly limited, as long as the temperature of the substrate 30 is set as the predetermined temperature. For example, a hot plate may be used for the temperature controller 16.

The coating head 20 is for forming a film on the substrate surface 30*a* of the substrate 30 in which an organic semiconductor material, a crystal material, an alignment material, and the like are used. Various kinds of solutions 36 (see FIG. 2) for forming a film for forming a film in which the organic semiconductor material, the crystal material, the alignment material, and the like are used are supplied from the supply portion 24 to the coating head 20. The configuration of the coating head 20 and the various kinds of solutions described above are specifically described below.

The substrate 30 corresponds to a single body of the substrate 30, and as well as, in a case where a layer (not illustrated) is formed on the substrate surface 30*a* of the substrate 30, and in a case where the film 38 (see FIG. 5) using an organic semiconductor material, a crystal material, an alignment material, and the like is formed on the surface of the layer (not illustrated), the surface of the layer corresponds to the substrate surface 30*a* of the substrate 30.

The configuration of the supply pipe 22 connected to the coating head 20 is not particularly limited, as long as various kinds of solutions used for forming the film may be supplied from the supply portion 24 to a portion between a blade surface 32*a* (see FIG. 2) of a coating blade 32 (see FIG. 2) of the coating head 20 and the substrate surface 30*a* of the substrate 30. It is preferable that the supply pipe 22 has flexibility so as to follow the coating head 20 in a case where the coating head 20 moves. The number of the supply pipe 22 is not limited to one, but may be plural, and may be appropriately determined according to the size of the coating blade 32 of the coating head 20 and the size of the formed film.

The supply portion 24 supplies the various kinds of solutions to a portion between the blade surface 32*a* (see FIG. 2) of the coating blade 32 (see FIG. 2) of the coating head 20 and the substrate surface 30*a* of the substrate 30, and, for example, includes a tank (not illustrated) that stores the various kinds of solutions, a pump (not illustrated) that delivers the various kinds of solutions in the tank to the coating head 20, and a flow meter (not illustrated) that measures a delivery amount of the various kinds of solutions. As the supply portion 24, for example, a syringe pump may be used.

It is preferable that the temperatures of the supply portion 24 and the supply pipe 22 are timely controlled by heating. It is preferable that the temperature is set to a temperature approximately equal to the substrate temperature. The various kinds of solutions 36 for forming the film is completely dissolved by heating, such that the various kinds of solutions 36 can be stably supplied. As the temperature difference of the various kinds of solutions 36 and the substrate 30 is smaller during the supply, a stable liquid reservoir 34 may be formed.

A sensor 21 that measures a distance between the substrate surface 30*a* of the substrate 30 disposed on the temperature controller 16 and the blade surface 32*a* (see FIG. 2) of the coating blade 32 (see FIG. 2) of the coating head 20 is provided in the coating head 20. This sensor 21 is connected to the controller 29, and based on the distance between the substrate surface 30*a* of the substrate 30 and the blade surface 32*a* (see FIG. 2) of the coating blade 32 (see FIG. 2), the driver 18, the supply portion 24, and the motor 28 are controlled by the controller 29. The configuration of the sensor 21 is not particularly limited, as long as the distance may be measured, and the distance is measured, for example, by an optical measuring method. For the sensor 21, a sensor using interference of light, a sensor using a common focus, and a sensor using laser light may be appropriately used.

The guide rail 26 moves the coating head 20 in the first direction D1 and the direction opposite thereto. The coating head 20 is attached to the guide rail 26 by a carriage 27.

The carriage 27 may be moved in the first direction D1 and the direction opposite thereto by the guide rail 26, and the coating head 20 is moved in the first direction D1 and the direction opposite thereto, together with the carriage 27. The carriage 27 is moved in the first direction D1 and the direction opposite thereto by the motor 28.

The position of the carriage 27 may be calculated from a reading value of a linear scale (not illustrated) provided on the guide rail 26, and the position in the first direction D1 of the coating head 20 may be calculated. The carriage 27 may change the attachment height and the attachment angle of the coating head 20. The moving speed of the coating head 20, that is, the moving speed of the blade surface 32a (see FIG. 2) of the coating blade 32 (see FIG. 2) is adjusted by the motor 28.

In the manufacturing device 10, the coating head 20 may be moved in the first direction D1 and the direction opposite thereof, and the substrate 30 may be moved in the first direction D1 and the direction opposite thereof.

The coating head 20 is specifically described below.

Figure 2:
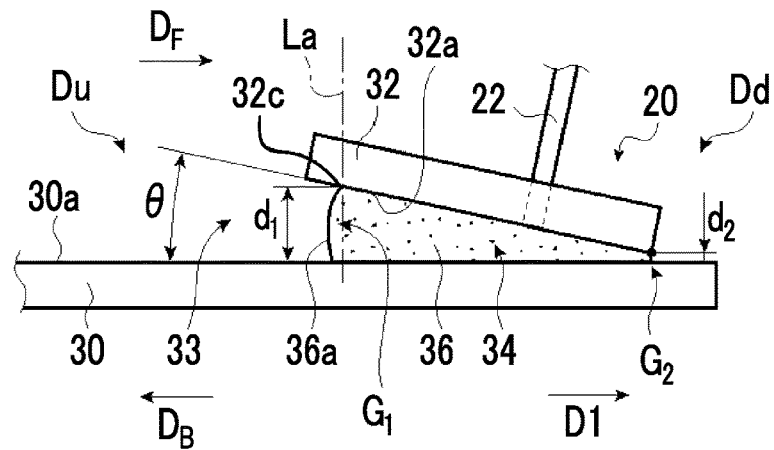
FIG. 2 is a schematic view illustrating a coating head of the manufacturing device used in the method of manufacturing a film according to the embodiment of the present invention.
Figure 3:
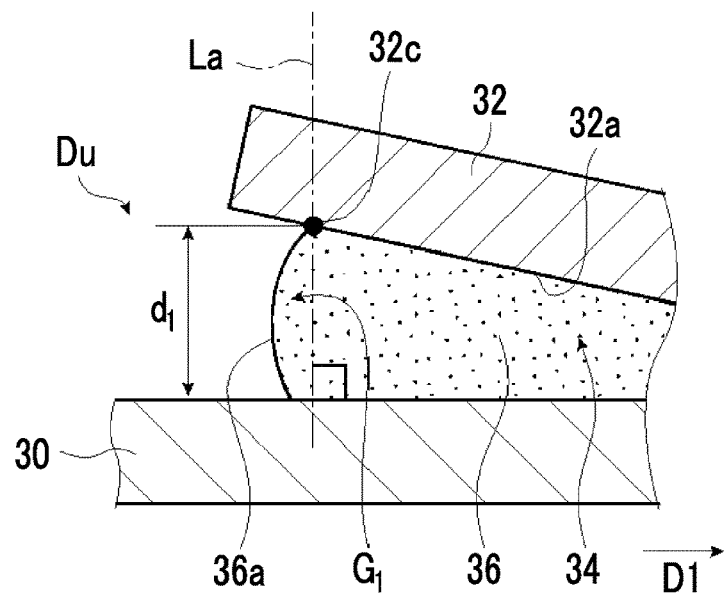
FIG. 3 is an enlarged view of a main part of one end portion of the coating head of the manufacturing device used in the method of manufacturing a film according to the embodiment of the present invention.
Figure 4:
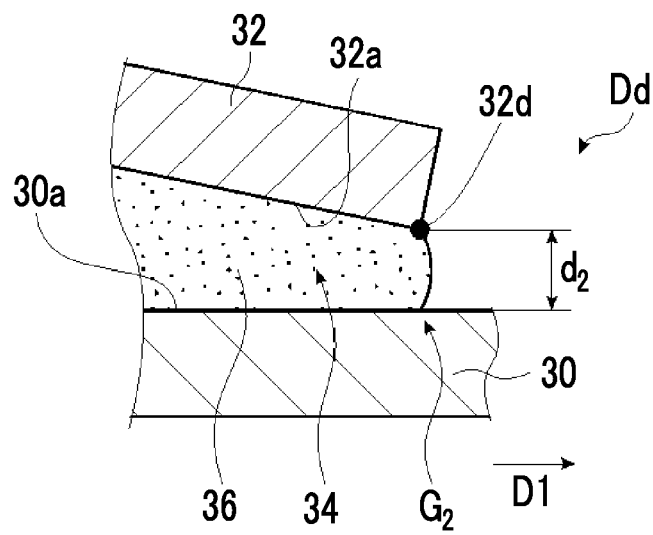
FIG. 4 is an enlarged view of a main part of the other end portion of the coating head of the manufacturing device used in the method of manufacturing a film according to the embodiment of the present invention.

FIG. 2 is a schematic view illustrating the coating head of the manufacturing device used in the method of manufacturing a film according to the embodiment of the present invention, FIG. 3 is an enlarged view of a main part of one end portion of the coating head used in the method of manufacturing a film according to the embodiment of the present invention, and FIG. 4 is an enlarged view of a main part of the other end portion of the coating head used in the method of manufacturing a film according to the embodiment of the present invention.

The coating head 20 has the coating blade 32 formed of a rectangular flat plate as shown in FIG. 2. The coating blade 32 is tilted with respect to the substrate surface 30a of the substrate 30 and is disposed to be spaced so as to face the substrate surface 30a of the substrate 30. The blade surface 32a of the coating blade 32 is disposed to be a tilted surface that is monotonically tilted with respect to the substrate surface 30a of the substrate 30. The blade surface 32a of the coating blade 32 may not be a tilted surface that is monotonically tilted and the blade surface 32a described below may be disposed to be a planar surface parallel to the substrate surface 30a.

A vertical tilt angle θ of the blade surface 32a of the coating blade 32 with respect to the substrate surface 30a of the substrate 30 is an angle formed by the substrate surface 30a of the substrate 30 and the blade surface 32a of the coating blade 32. The length of the coating blade 32 is not particularly limited, but corresponds to a width Lc of a coating film, and thus is set as necessary (see FIG. 6).

Figure 6:
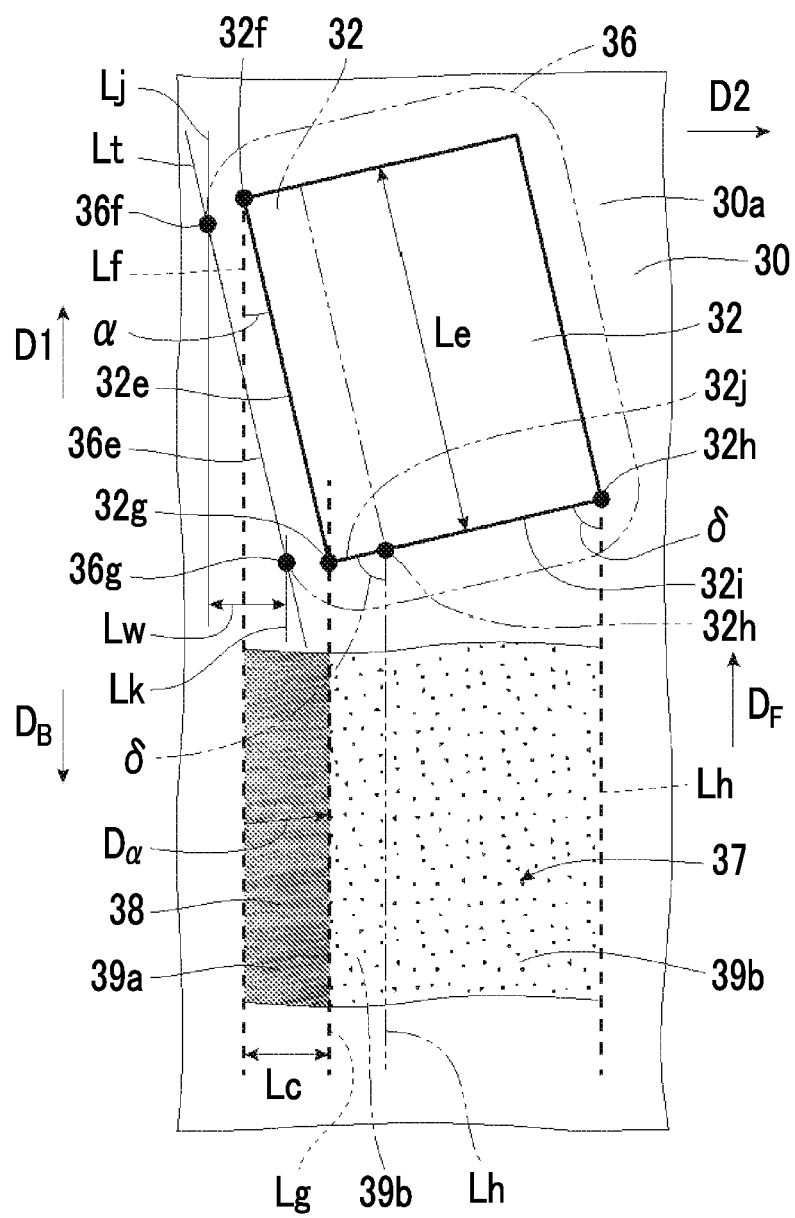
FIG. 6 is a plan view for describing the method of manufacturing a film according to the embodiment of the present invention.

In the coating blade 32, at least a portion of an outer peripheral end portion that is in contact with the solutions 36 of the coating blade 32 is disposed to be tilted with respect to the first direction D1 in the plane P (see FIG. 10) which is parallel to the substrate surface 30a of the substrate 30. For example, in the coating blade 32, as illustrated in FIG. 6 described below, a tilted portion 32e of the coating blade 32 is disposed to be tilted with respect to the first direction D1 by a tilt angle α in the plane P (see FIG. 10) which is parallel to the substrate surface 30a described above and a tilted portion 32i is disposed to be tilted with respect to the first direction D1 by a tilt angle δ in the plane P (see FIG. 10) which is parallel to the substrate surface 30a described above. The coating blade 32 has two tilted portions 32e and 32i tilted with respect to the first direction D1 in the plane P (see FIG. 10) which is parallel to the substrate surface 30a described above, and all of these are formed with a tilted surface tilted with respect to the first direction D1 in the plane P (see FIG. 10) parallel to the substrate surface 30a described above.

In the coating head 20, the various kinds of solutions 36 are supplied from the supply portion 24 via the supply pipe 22, and the liquid reservoir 34 of the various kinds of solutions 36 described above is formed between the substrate surface 30a of the substrate 30 and the blade surface 32a of the coating blade 32. In this manner, the blade surface 32a of the coating blade 32 is in contact with the various kinds of solutions 36 described above, and the liquid reservoir 34 is a region in which the blade surface 32a of the coating blade 32 and the various kinds of solutions 36 described above are in contact with each other.

The blade surface 32a of the coating blade 32 of the coating head 20 has the first gap $G_1$ and the second gap $G_2$ having different separation gap sizes in the first direction D1 in the liquid reservoir 34 provided between the blade surface 32a and the substrate surface 30a of the substrate 30. The coating blade 32 is disposed to have the first gap $G_1$ on an upstream side Du in the first direction D1 and the second gap $G_2$ having a smaller gap size compared with the first gap $G_1$ on a downstream side Dd in a region in which the blade surface 32a and the various kinds of solutions 36 described above are in contact with each other.

The first gap $G_1$ is clearance with one end portion of the liquid reservoir 34 in the first direction D1. In the coating head 20 illustrated in FIG. 2, the first gap $G_1$ is in the end portion on the side opposite to the first direction D1 of the liquid reservoir 34 of the coating blade 32, that is, the upstream side Du in the first direction D1. In the coating head 20 illustrated in FIG. 2, the second gap $G_2$ is, for example, clearance with the substrate surface 30a of the substrate 30 of the other end portion of the liquid reservoir 34 in the first direction D1. The second gap $G_2$ is in the end portion of the first direction D1 of the liquid reservoir 34, that is, the downstream side Dd in the first direction D1. The blade surface 32a of the coating blade 32 and the substrate surface 30a of the substrate 30 are open on the first gap $G_1$ side, to form an open portion 33. In a case where a film is manufactured by forming the liquid reservoir 34 in this form, it is possible to suppress the generation of the vibration of the various kinds of solutions 36 in the liquid reservoir 34 so as to improve the film quality of the film 38. Therefore, in a case where the thin film transistor is manufactured, satisfactory characteristics may be obtained. In contrast, the first gap may be set to an end portion in the first direction D1 of the liquid reservoir 34 and the second gap may be set to an end portion on the opposite side thereof.

The coating head 20, that is, the blade surface 32a of the coating blade 32 is moved in the first direction D1 in a case where the film 38 is formed. In a case where the film 38 is formed, the substrate surface 30a of the substrate 30 may be moved in a direction $D_B$. The direction $D_B$ may be referred to as a substrate transportation direction.

As illustrated in FIG. 3, a size $d_1$ of the first gap $G_1$ is a length between the location 32c and the substrate surface 30a of the substrate 30 in a straight line La perpendicular to the substrate surface 30a of the substrate 30 through a location 32c in which a liquid surface 36a of the various kinds of solutions 36 in the open portion 33 of the liquid reservoir 34 is in contact with the blade surface 32a of the coating blade 32.

A size $d_2$ of the second gap $G_2$ is a minimum distance between the substrate surface 30a of the substrate 30 and the blade surface 32a of the coating blade 32 of the coating head 20 in the liquid reservoir 34 and is 40 μm or less. In the coating blade 32, as described above, the blade surface 32a is monotonically tilted with respect to the substrate surface 30a of the substrate 30. In this case, a length between the substrate surface 30a of the substrate 30 and a corner portion 32d of the coating blade 32 illustrated in FIG. 4 becomes a minimum distance. Therefore, in the coating head 20 illustrated in FIG. 2, the size $d_2$ of the second gap $G_2$ is a length between the substrate surface 30a of the substrate 30 and the corner portion 32d of the coating blade 32. A range from the location 32c described above to the corner portion 32d described above on the blade surface 32a of the coating blade 32 is a range in which the coating blade 32 and the solutions 36 are in contact with each other, and a range from the location 32c described above to the corner portion 32d described above is referred to as a solution storing portion.

The size $d_1$ of the first gap $G_1$ is preferably 0.5 mm to 5 mm. The size $d_1$ is more preferably 0.5 mm to 1.6 mm.

In a case where the size $d_1$ of the first gap $G_1$ is 0.5 mm to 5 mm, the various kinds of solutions 36 sufficient for forming the film 38 may be secured in the liquid reservoir 34.

With respect to the size $d_1$ of the first gap $G_1$ and the size $d_2$ of the second gap $G_2$, the size $d_2$ of the second gap $G_2$ is measured in an amount of raising the carriage 27 from a state of bringing the blade surface 32a of the coating blade 32 to come into contact with the substrate surface 30a of the substrate 30. In a case where a micrometer (not illustrated) for height adjustment is provided in the carriage 27, the size $d_2$ of the second gap $G_2$ may be measured. In a case where the vertical tilt angle θ of the coating blade 32 is known, the size $d_1$ of the first gap $G_1$ may be also calculated from the length of the coating blade 32.

Specifically, the size $d_1$ of the first gap $G_1$ obtains a digital image including the substrate 30 from the side surface of the coating blade 32, this digital image is stored in a computer, the straight line La is drawn on the digital image based on the digital image, and the length between the location 32c of the blade surface 32a and the substrate surface 30a of the substrate 30 is measured on the computer.

The size $d_2$ of the second gap $G_2$ obtains a digital image including the substrate 30 from the side surface of the coating blade 32, this digital image is stored in the computer, and a length between the substrate surface 30a of the substrate 30 and the corner portion 32d of the blade surface 32a of the coating blade 32 is measured on the computer, based on the digital image.

For example, the vertical tilt angle θ of the coating blade 32 is preferably 1° to 14°. The vertical tilt angle θ is more preferably 1° to 9° and even more preferably 4° to 9°.

In a case where the vertical tilt angle θ is 1° to 14°, the various kinds of solutions 36 in an appropriate amount may be stored, and a crystal film having high mobility may be manufactured at a fast moving speed. The vertical tilt angle θ is not determined thereto, since in a case where the first gap $G_1$ and the second gap $G_2$ are controlled in the above range, the tilt angle θ is determined according to the relationship with the length of the coating blade 32.

The vertical tilt angle θ may be measured with a micrometer (not illustrated) for angle adjustment provided in the carriage 27. More specifically, a digital image including the substrate 30 is obtained from the side surface of the coating blade 32, this digital image is stored in a computer, and an angle formed by the substrate surface 30a of the substrate 30 and the blade surface 32a of the coating blade 32 is created on the digital image based on the digital image, so as to obtain the angle on the computer. In a case where the blade surface 32a of the coating blade 32 is not clear, a center line of the thickness of the coating blade 32 is used.

With respect to the tilt angle α and the tilt angle δ, a digital image including the coating blade 32 from the substrate surface 30a side is acquired, this digital image is stored in a computer, and a straight line Lf that passes through one vertex 32f the tilted portion 32e of the coating blade 32 and that is parallel to the first direction D1 based on this digital image is drawn. An angle formed by the straight line Lf with the tilted portion 32e, that is, the tilt angle α is obtained.

The tilt angle α may be larger than 0°, and it is preferable that the angle is smaller, since the coating speed can be increased. Meanwhile, the tilt angle α influence on the width Lc of a coating film, and as the tilt angle α becomes smaller, the width Lc becomes shorter. For this trade-off, the tilt angle α is set so that the coating speed and the width Lc become appropriate.

With respect to the tilt angle δ, a straight line Lh that passes through one vertex 32h of the tilted portion 32i of the coating blade 32 and that is parallel in the first direction D1 is drawn. The angle formed by the straight line Lh with the tilted portion 32i, that is, the tilt angle δ is obtained.

The size $d_2$ of the second gap $G_2$ is preferably 100 μm or less. That is, it is preferable that a minimum distance between the blade surface 32a and the substrate surface 30a in the coating blade 32 is 100 μm or less. For example, the lower limit of the size $d_2$ of the second gap $G_2$ is 10 μm.

In a case where the size $d_2$ of the second gap $G_2$ is 100 μm or less, the generation of the vibration of the various kinds of solutions 36 in the liquid reservoir 34 can be suppressed, the film quality of the film 38 can be improved, and the moving speed of the coating blade 32 can be increased. Therefore, in a case where the thin film transistor is manufactured, a thin film transistor with satisfactory characteristics can be obtained with high productivity.

Meanwhile, in a case where the size $d_2$ of the second gap $G_2$ is greater than 100 μm, the various kinds of solutions 36 in the liquid reservoir 34 vibrates, so as to deteriorate the film quality of the film 38. Therefore, in a case where the thin film transistor is manufactured, satisfactory characteristics may not be obtained.

In the coating head 20, the coating blade 32 has the first gap $G_1$ and the second gap $G_2$ and is disposed on the substrate surface 30a of the substrate 30, the liquid reservoir 34 can be caused to be present only between the blade surface 32a of the coating blade 32 and the substrate surface 30a of the substrate 30 by the supply amount of the solution 36, and the solution 36 can be caused to reach the tilted portion 32e of the coating blade 32 (see FIG. 6).

In a case where the solutions 36 reaches the tilted portion 32e of the coating blade 32 (see FIG. 6), the solutions 36 does not move between the coating blade 32 and the substrate surface 30a, such that the vibration can be suppressed. Therefore, it is preferable to supply the solutions 36 to reach the tilted portion 32e.

The coating blade 32 is formed, for example, by glass, quartz glass, and stainless steel.

For example, a glass substrate or a plastic substrate is used in the substrate 30.

Examples of the plastic substrate include polyesters such as polyethylene terephthalate (PET) and polyethylene naphthalate (PEN), polyolefins such as polyethylene (PE), polypropylene (PP), polystyrene, ethylene vinyl acetate (EVA), a cycloolefin polymer (COP), and a cycloolefin copolymer (COC), a vinyl resin, polycarbonate (PC), polyamide, polyimide, an acrylic resin, and triacetyl cellulose (TAC). The plastic substrate is not folded even in a case of being bent, and is used, for example, in the case of forming by a roll to roll method.

Subsequently, the method of manufacturing a film is described.

Figure 5:
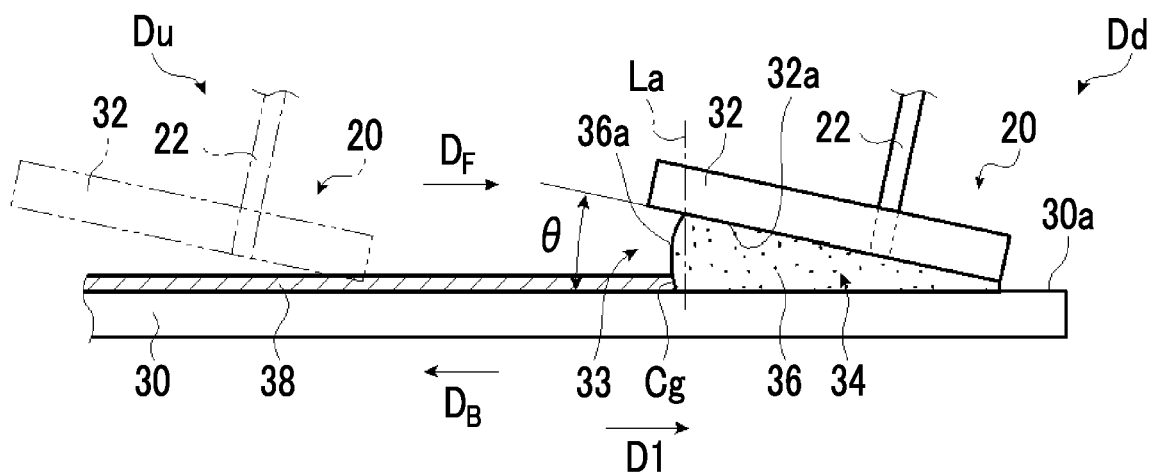
FIG. 5 is a schematic view illustrating the method of manufacturing a film according to the embodiment of the present invention.

FIG. 5 is a schematic view illustrating a method of manufacturing a film according to the embodiment of the present invention, and FIG. 6 is a plan view for describing the method of manufacturing a film according to the embodiment of the present invention.

The blade surface 32a of the coating blade 32 is set to be in a state of providing the first gap $G_1$ and the second gap $G_2$ to the substrate surface 30a of the substrate 30. The first gap $G_1$ is larger than the second gap $G_2$, and thus the coating blade 32 of the flat plate is disposed such that the blade surface 32a is tilted by the vertical tilt angle θ. As illustrated in FIG. 6, the coating blade 32 is tilted by the tilt angle α with respect to the first direction D1 in the plane P (see FIG. 10) parallel to the substrate surface 30a described above.

Subsequently, the various kinds of solutions 36 are supplied from the supply portion 24 to the liquid reservoir 34 via the supply pipe 22. At this point, the temperature of the substrate 30 is a temperature that is predetermined by the temperature controller 16.

While the various kinds of solutions 36 are supplied to a portion between the coating blade 32 of the coating head 20 and the substrate surface 30a of the substrate 30, that is, to the liquid reservoir 34, as illustrated in FIGS. 5 and 6, the blade surface 32a of the coating blade 32 is moved to the substrate surface 30a of the substrate 30 in the first direction D1 at a predetermined moving speed in a state in which the coating head 20, that is, the blade surface 32a of the coating blade 32 is in contact with the various kinds of solutions 36. Accordingly, the region in which the liquid surface 36a of the various kinds of solutions 36 of the open portion 33 is in contact with the substrate surface 30a of the substrate 30 becomes a crystal growth portion Cg (see FIG. 5) that becomes a starting point for forming the film 38, and the film 38 is sequentially formed in the direction $D_F$ from the crystal growth portion Cg. In this manner, while the various kinds of solutions 36 are applied in the first direction D1 of moving the coating head 20, that is, the coating blade 32, in the manufacturing step, the film 38 may be formed in the first direction D1.

In the coating blade 32, a range between the straight line Lf that passes through the vertex 32f of the coating blade 32 and that is parallel in the first direction D1 and the straight line Lh that passes through the vertex 32h of the coating blade 32 and that is parallel in the first direction D1 as illustrated in FIG. 6 is a film forming area 37. In the coating blade 32, the film forming area 37 is formed with two of the tilted portion 32e and the tilted portion 32i, and a film can be formed with two of the tilted portion 32e and the tilted portion 32i. The tilt angle α of the tilted portion 32e is smaller than the tilt angle δ of the tilted portion 32i.

In the coating blade 32, the film 38 is formed in a range 39a between a straight line Lg that passes through a vertex 32g of the tilted portion 32e and that is parallel in the first direction D1 and the straight line Lf. That is, the high quality film 38 is formed in the tilted portion 32e. It is checked that, in the tilted portion 32i, a high quality film is hardly obtained. That is, in a range 39b between the straight line Lg and the straight line Lh, a high quality film is hardly obtained. Therefore, in the same manner as in the coating blade 32, in a case of being tilted with respect to the first direction D1 in the plane P (see FIG. 10) parallel to the substrate surface 30a described above, substantially, the high quality film 38 is formed only with the tilted portion 32e having a minimum tilt angle. In a case where the tilt angle α is greater than 45°, the tilt angle δ becomes smaller, the film 38 does not become a high quality film, and thus a high quality film is formed in the range 39b between the straight line Lg and the straight line Lh, which is the film forming area 37, that is, in the tilted portion 32i. A preferable angle of the tilt angle α and the tilt angle δ is described below.

According to the coating speed, a high quality film is formed in all of the range 39b between the straight line Lg and the straight line Lh and the range 39a between the straight line Lf and the straight line Lg, in some cases.

In the configuration of the coating blade 32 illustrated in FIG. 6, the width of the coating blade 32 may be caused to be narrow. That is, the length of the tilted portion 32i of the coating blade 32 may be caused to be short. Also in this case, in the range 39a between the straight line Lf and the straight line Lg, that is, in the tilted portion 32e, the high quality film 38 is formed, and in the range 39b between the straight line Lg and the straight line Lh, that is, in the tilted portion 32i, a high quality film is hardly formed.

In a case where a distance of between the straight line Lf and the straight line Lg in the second direction D2 is set as the width Lc, the width Lc becomes a width of the film 38. In a case where a length of the tilted portion 32e of the coating blade 32 is set as Le, Lc satisfies Lc=Le×sin α.

Here, in a case where an upper limit of a growth rate obtained by a high quality film in a random temperature is set as Vg (mm/min), a moving speed VB (mm/min) of the coating blade 32 is represented by VB<Vg/sin α. From this, a width of the film 38, that is, the width Lc can be controlled by the length Le of the tilted portion 32e. By the tilt angle α, the moving speed VB of the coating blade 32 and a width of the film 38, that is, the width Lc can be changed, and the film 38 corresponding to the formed width can be obtained. In order to increase the productivity, it is required to increase the moving speed VB of the coating blade 32. Therefore, it is preferable that the tilt angle α is smaller. The width Lc can be adjusted by the blade length Le.

The lower limit of the tilt angle α is preferably more than 0°, more preferably 1° or more, and even more preferably 3° or more. The upper limit of the tilt angle α is preferably 45° or less, more preferably 30° or less, even more preferably 20° or less, and particularly preferably 10° or less. The upper limit and the lower limit of the tilt angle δ are preferably the same as the upper limit and the lower limit of the tilt angle α. Among two of the tilted portions 32e and 32i, at least the smaller tilt angle is preferably 45° or less.

An alignment film of which an alignment direction is specified with the coating blade 32 tilted by the tilt angle α is formed as the film 38, the alignment direction Dα of the alignment film is a tilt angle of 90°−α°.

Figure 7:
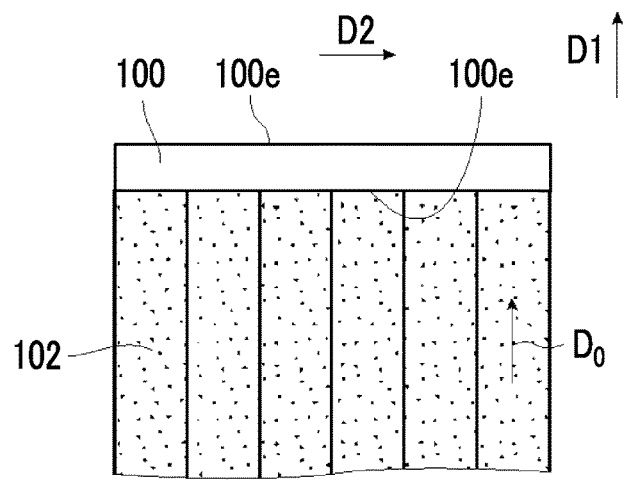
FIG. 7 is a schematic view illustrating a film obtained by a manufacturing method in the related art.

Here, the standard of 90° is described. As illustrated in FIG. 7, a narrow and long rectangular coating blade 100 having a side 100e elongating in the second direction D2 is moved in the first direction D1, and the alignment direction $D_0$ of an alignment film 102 formed with the side 100e is used as a standard. That is, the alignment direction $D_0$ of the alignment film 102 is set to 0°. In this manner, the alignment film 102 described above and the film 38 formed with the coating blade 32 tilted by the tilt angle α have different alignment directions. With respect to the alignment direction, in a case of the organic semiconductor film, the alignment direction can be checked and specified by observing the organic semiconductor film with a polarizing microscope.

In a case of forming the film 38, in a case where the solutions 36 protrude from the coating blade 32, a tangent line Lt of an outer peripheral end portion 36e corresponding to the tilted portion 32e of the coating blade 32 of the solutions 36 is also tilted by the tilt angle α with respect to the first direction D1 in the plane P (see FIG. 10) that is parallel to the substrate surface 30a described above, and the outer peripheral end portion 36e also is tilted with respect to the first direction D1. A state in which the solutions 36 protrude refers to a state in which the solutions 36 are in contact with a side surface of the coating blade 32. Also in a case where the solutions 36 protrude from the coating blade 32, using the tilted outer peripheral end portion 36e as a starting point, the film 38 is formed in the outer peripheral end portion 36e, and the high quality film 38 which are the same as the coating blade 32 described above can be obtained. In this case, in a range of a width Lw in the second direction D2, between a straight line Lj that passes through an end point 36f of the tangent line Lt of the outer peripheral end portion 36e in the first direction D1 and that is parallel in the first direction D1 and a straight line Lk that passes through an end point 36g and that is parallel in the first direction D1, the film 38 is formed. The width Lw corresponds to the width Lc described above. For example, the protrusions of the solutions 36 from the coating blade 32 can be visually checked. The protrusions of the solutions 36 from the coating blade 32 can be realized by increasing a supply amount of the solutions 36.

In a case where the protrusions are excessive, the solutions 36 easily vibrate, such that a discontinuous film is easily formed. Therefore, it is preferable that there are less protrusions and it is more preferable that there is no protrusion.

In the step of manufacturing the film 38, the supply amount of the various kinds of solutions 36 is appropriately determined according to the temperature and the moving speed of the substrate 30 and the size of the film 38 to be formed. In the step of the manufacturing of the film 38, the solutions 36 may be continuously supplied to a portion between the blade surface 32a and the substrate surface 30a.

With respect to the crystal growth portion Cg, a digital image including the liquid reservoir 34 and the film 38 are obtained, this digital image is stored in a computer, a portion near the boundary of the liquid reservoir 34 and the film 38 is visually observed based on this digital image, so as to specify the crystal growth portion Cg.

It is described that, in the step of manufacturing the film 38, the coating head 20, that is, the blade surface 32a of the coating blade 32 is moved in the first direction D1, so as to form the film 38, but the present invention is not limited thereto. The film 38 may be formed in the direction $D_F$ also by moving the substrate 30 in the direction $D_B$ at a predetermined moving speed.

The direction $D_F$ is the same direction as the first direction D1 and the direction from the first gap $G_1$ toward the second gap $G_2$. The direction $D_B$ is the reverse direction of the direction $D_F$, that is, the direction from the second gap $G_2$ toward the first gap $G_1$.

In a case where the boiling point of the solvent of the various kinds of solutions 36 is set to Tb° C., and the temperature of the substrate surface 30a of the substrate 30 is set to Ts° C., in the step of manufacturing the film 38, it is preferable that a temperature Ts of the substrate surface 30a of the substrate 30 is maintained to the temperature satisfying Tb−30° C.≤Ts≤Tb. In a case where the temperature Ts is in this temperature range, the film formation speed of the film 38 may be increased, so as to increase the productivity of the film 38.

It is more preferable that the temperature Ts of the substrate surface 30a of the substrate 30 in a case of forming the film 38 is maintained at the temperature of Tb−20° C.≤Ts≤Tb.

The moving speed of the coating head 20 in a case of forming the film 38, that is, the moving speed of the blade surface 32a of the coating blade 32 is preferably 50 mm/min or faster. In a case where the moving speed is 50 mm/min or faster, with respect to the film 38, fast film formation speed may be obtained, so as to increase the productivity. The upper limit of the moving speed is about 150 mm/min, and in a case where the moving speed is up to about 150 mm/min, the film 38 having high crystallinity, high mobility, and the like and a satisfactory film quality can be obtained.

In a case where the substrate 30 is moved in a case of forming the film 38, the moving speed of the substrate 30 may be set to be the same as the moving speed of the coating head 20, that is, the moving speed of the blade surface 32a of the coating blade 32. The film 38 is formed, for example, in the atmosphere and at atmospheric pressure.

In the manufacturing step of the film 38, the distance between the blade surface 32a of the coating blade 32 and the substrate surface 30a of the substrate 30 is measured by the sensor 21, the sizes of the first gap $G_1$ and the second gap $G_2$ are maintained, and the blade surface 32a is moved in the first direction D1.

Subsequently, an example of the thin film transistor manufactured by using the method manufacturing of the film is described.

Figure 8:
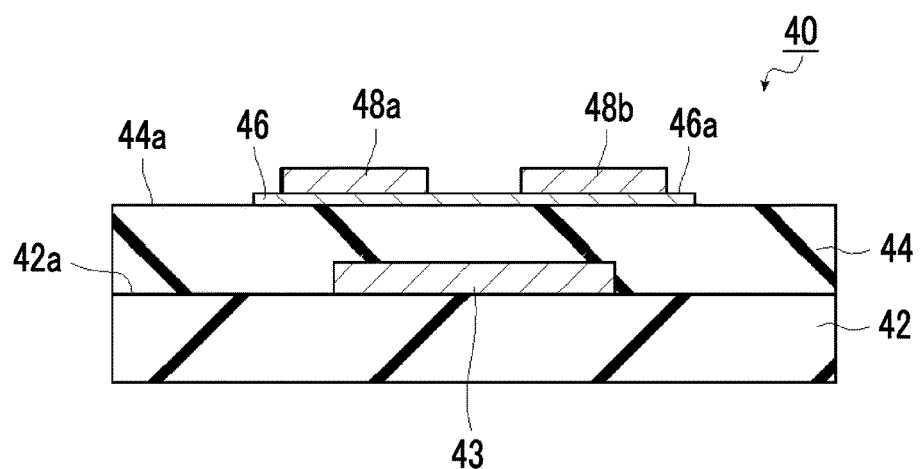
FIG. 8 is a schematic cross-sectional view illustrating an example of a thin film transistor manufactured by using the method of manufacturing a film according to the embodiment of the present invention.

FIG. 8 is a schematic cross-sectional view illustrating an example of a thin film transistor manufactured by using the method of manufacturing a film according to the embodiment of the present invention.

A thin film transistor 40 illustrated in FIG. 8 is a bottom gate and top contact-type transistor. In the thin film transistor 40, the gate electrode 43 is formed on a surface 42a of a substrate 42. An insulating film 44 that covers the gate electrode 43 is formed on the surface 42a of the substrate 42. An organic semiconductor layer 46 is formed on a surface 44a of the insulating film 44. The organic semiconductor layer 46 is manufactured by the method of manufacturing a film. A source electrode 48a and a drain electrode 48b are formed on a surface 46a of the organic semiconductor layer 46.

In the thin film transistor 40, the organic semiconductor layer 46 is formed on the surface 44a of the insulating film 44, but, in this case, as described above, the surface 44a of the insulating film 44 corresponds to the substrate surface 30a of the substrate 30.

A transistor in which an organic semiconductor film is formed by the method of manufacturing a film is not limited to the bottom gate and top contact-type thin film transistor 40 illustrated in FIG. 7. The transistor may be a bottom gate and bottom contact-type thin film transistor, may be a top gate and top contact-type thin film transistor, or may be a top gate and bottom contact-type thin film transistor.

In addition to the manufacturing of the thin film transistor 40 described above, the method of manufacturing a film can be used in the manufacturing of various films, such as a photoelectric conversion film and a photoelectric modulation film of an organic solar cell or the like, an electrooptical conversion film and an electric light modulation film of an organic EL or the like, a memory such as an organic ferroelectric memory, an organic conductive film, an inorganic conductive film, a polarizing film, an optical phase difference film, a light guide, an optical amplification film, a gas sensor such as a volatile organic compound (VOC) sensor, a self-assembled film such as a block copolymer, a molecular alignment film, and a nanoparticle alignment film.

Figure 9:
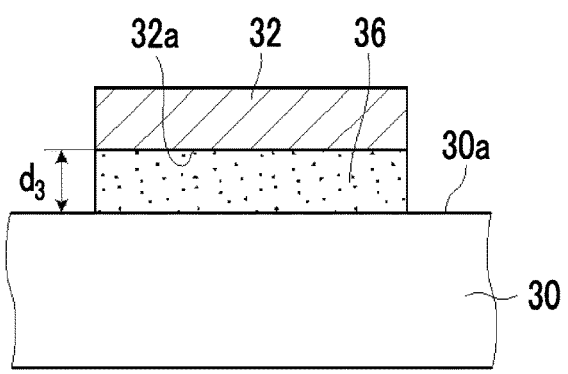
FIG. 9 is a schematic view illustrating another example of a disposition of a coating blade.

The coating blade 32 described above is vertically tilted to the substrate surface 30a by the vertical tilt angle θ, but the present invention is not limited thereto, and for example, as illustrated in FIG. 9, the blade surface 32a of the coating blade 32 may be caused to be parallel to the substrate surface 30a. That is, the blade surface 32a may be caused to have a constant distance to the substrate surface 30a. In this case, a distance $d_3$ between the blade surface 32a and the substrate surface 30a is preferably 100 μm or less. In a case where the distance $d_3$ is 100 μm or less, the generation of the vibration of the solutions 36 in the liquid reservoir 34 can be suppressed and the moving speed of the coating blade 32 can be increased, as described above.

Figure 10:
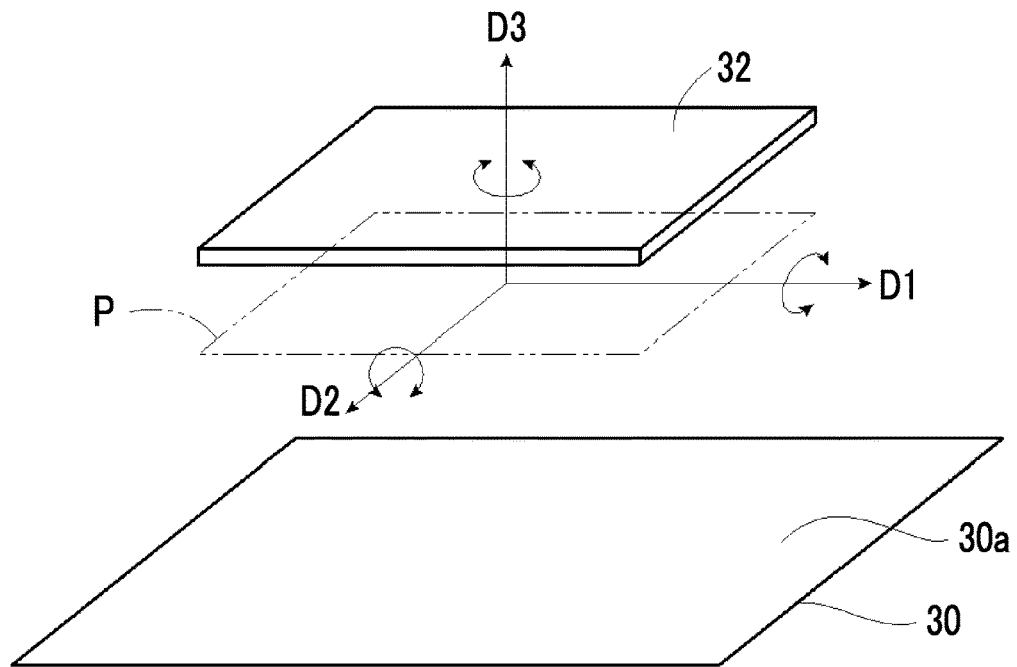
FIG. 10 is a schematic perspective view for illustrating a tilt of the coating blade.

In a case where the coating blade 32 is tilted with respect to at least one direction of the first direction D1 in the plane P parallel to the substrate surface 30a illustrated in FIG. 10, the second direction D2, or the third direction D3, the same effect as in the coating blade 32 illustrated in FIGS. 2 to 4 described above can be obtained.

Figure 11:
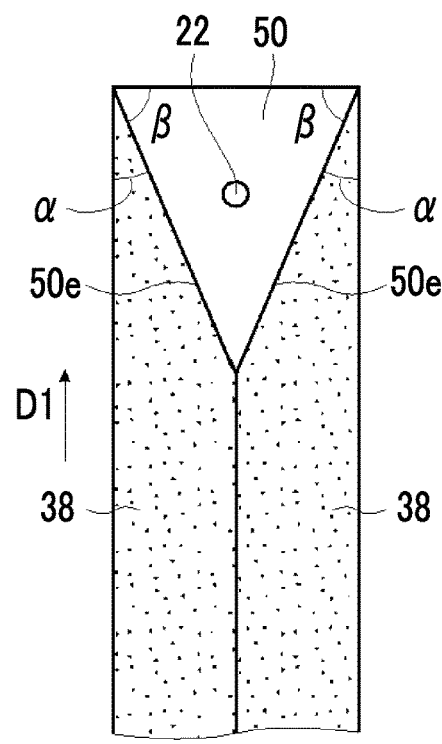
FIG. 11 is a schematic view illustrating a first other example of the coating blade.
Figure 12:
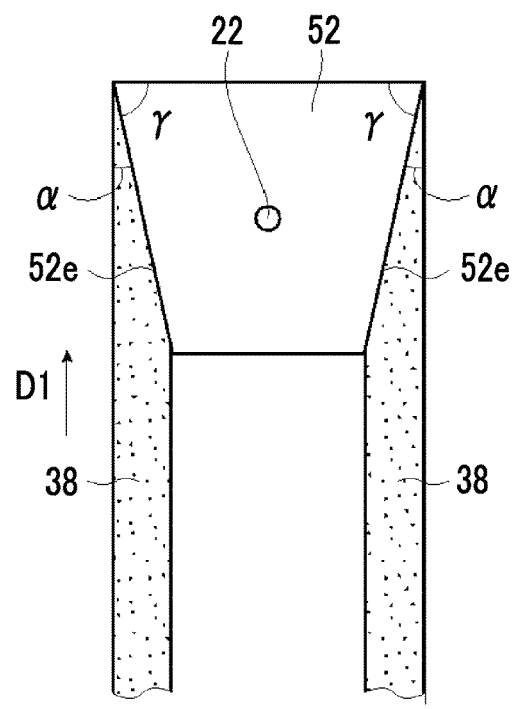
FIG. 12 is a schematic view illustrating a second other example of the coating blade.

The coating blade 32 has a rectangular shape in a plan view, the shape of the coating blade 32 is not particularly limited as long as the coating blade 32 has a tilted portion including a tilted surface or the like, and for example, a configuration as illustrated in FIGS. 11 and 12 may be used. FIGS. 11 and 12 illustrate plan views of a plane on which the coating blade and the solution are in contact with each other, and the shape other than the contact surface with the solution is not particularly limited.

Figure 13:
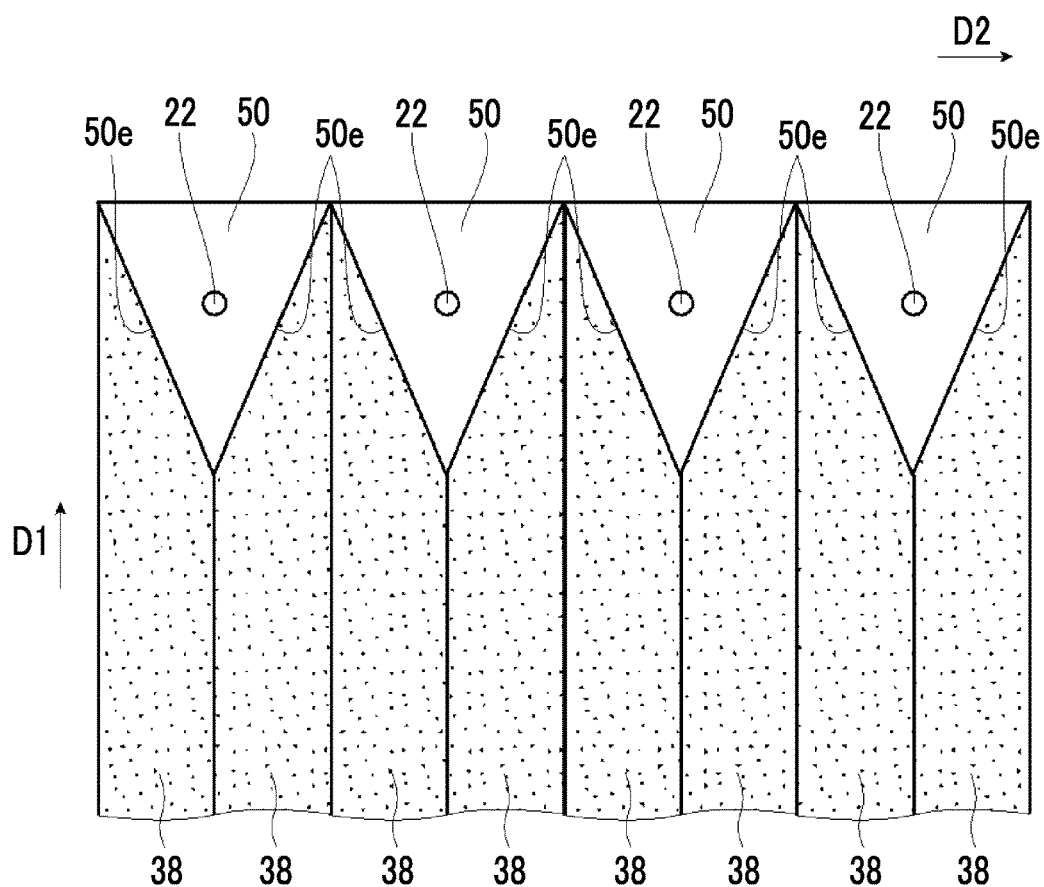
FIG. 13 is a schematic view illustrating a third other example of the coating blade.

Here, FIG. 11 is a schematic view illustrating another example of the coating blade, FIG. 12 is a schematic view illustrating another second example of the coating blade, and FIG. 13 is a schematic view illustrating another third example of the coating blade. In FIGS. 11 to 13, the same components as illustrated in FIGS. 5 and 6 are denoted by the same reference numerals, and detailed descriptions thereof are omitted.

As illustrated in FIG. 11, a coating blade 50 having a triangular shape in a plan view may be used. In the coating blade 50, the film 38 can be formed by using the two oblique sides 50e of a triangle as tilted portions. In this case, in a case where an angle of the oblique side 50e is set as $\beta°$, the tilt angle $\alpha$ is represented by tilt angle $\alpha=90°-$angle $\beta$.

As illustrated in FIG. 12, a coating blade 52 having a trapezoidal shape in a plan view may be used. In the coating blade 52, the oblique side 52e having a trapezoidal shape may be used as a tilted portion such that the film 38 can be formed. In this case, in a case where the angle of the oblique side 52e of having a trapezoidal shape is set as $\gamma°$, the tilt angle $\alpha$ is represented by tilt angle $\alpha=90°-$angle $\gamma$.

As described above, it is preferable that the coating blade has a shape having an oblique side in a plan view. A configuration in which at least a portion of an outer peripheral end portion that is in contact with the solutions 36 of the coating blades 50 and 52 is tilted with respect to the first direction D1 in the plane P (see FIG. 10) parallel to the substrate surface 30a described above may be used.

As illustrated in FIG. 13, the film 38 is formed by disposing a plurality of coating blades 50 disposed in the second direction parallel to a plane parallel to the substrate surface and orthogonal to the first direction, and supplying the solutions to the plurality of coating blades. Accordingly, the film 38 can be formed in a wide range by moving the plurality of coating blades 50 in the first direction D1 at the same time. In the configuration illustrated in FIG. 13, the film 38 may be formed by supplying different solutions for each of the coating blades 50. A different film can be formed by changing the composition of the solution for each of the coating blades 50. Each of the films can be formed in an adjacent manner. More correctly, it is required that the plurality of coating blades 50 are spaced from each other such that the solutions do not mix. The parallel film 38 can be intermittently formed in the second direction D2 by selectively supplying the solution among the plurality of coating blades 50. In this case, for example, the formation pattern can be formed by moving the plurality of coating blades 50 in the first direction D1 at the same time.

Figure 14:
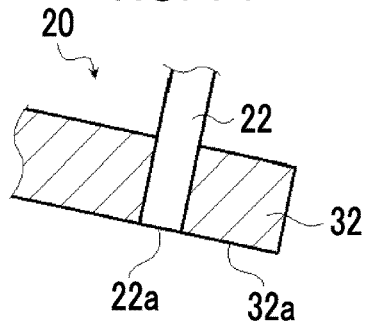
FIG. 14 is a schematic cross-sectional view illustrating a first example of a disposition position of a supply port of a supply pipe in the coating head used in the method of manufacturing a film according to the embodiment of the present invention.
Figure 15:
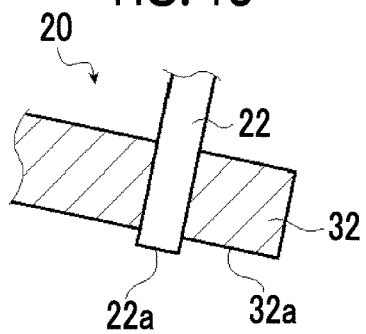
FIG. 15 is a schematic cross-sectional view illustrating a second example of the disposition position of the supply port of the supply pipe in the coating head used in the method of manufacturing a film according to the embodiment of the present invention.
Figure 16:
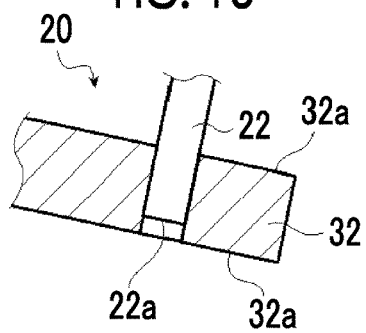
FIG. 16 is a schematic cross-sectional view illustrating a third example of the disposition position of the supply port of the supply pipe in the coating head used in the method of manufacturing a film according to the embodiment of the present invention.

FIG. 14 is a schematic cross-sectional view illustrating a first example of a disposition position of a supply port of a supply pipe in the coating head used in the method of manufacturing a film according to the embodiment of the present invention, FIG. 15 is a schematic cross-sectional view illustrating a second example of a disposition position of the supply port of the supply pipe in the coating head, and FIG. 16 is a schematic cross-sectional view illustrating a third example of a disposition position of the supply port of the supply pipe in the coating head.

In the coating head 20, as illustrated in FIG. 14, a supply port 22a of the supply pipe 22 in the coating blade 32 may be flush with the blade surface 32a of the coating blade 32, but the present invention is not limited thereto. As illustrated in FIG. 15, the supply port 22a of the supply pipe 22 may protrude from the blade surface 32a of the coating blade 32, and the supply port 22a of the supply pipe 22 illustrated in FIG. 16 is drawn inside the blade surface 32a of the coating blade 32 to be in the inside portion of the coating blade 32. The supply port 22a is to supply the various kinds of solutions 36.

The disposition position of the supply port 22a of the supply pipe 22 is not particularly limited, and for example, in a case where the length in the first direction D1 which is obtained by projecting the liquid reservoir 34 that is a region in which the coating head 20 and the various kinds of solutions 36 are in contact with each other to the substrate surface 30a of the substrate 30 is divided into four at an equal interval, the supply port 22a is preferably disposed in two subdivisions in the center. In the coating head 20 illustrated in FIGS. 2 to 4, the range of projecting the liquid reservoir 34 is from the perpendicular straight line La to the corner portion 32d of the coating blade 32.

Subsequently, another method of manufacturing a film according to the embodiment of the present invention is described.

Figure 17:
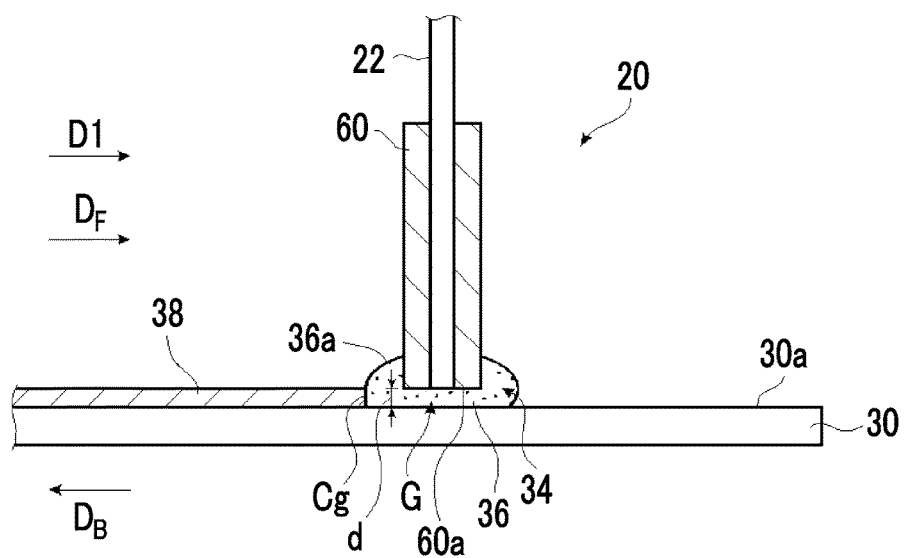
FIG. 17 is a schematic cross-sectional view illustrating another method of manufacturing a film according to the embodiment of the present invention.
Figure 18:
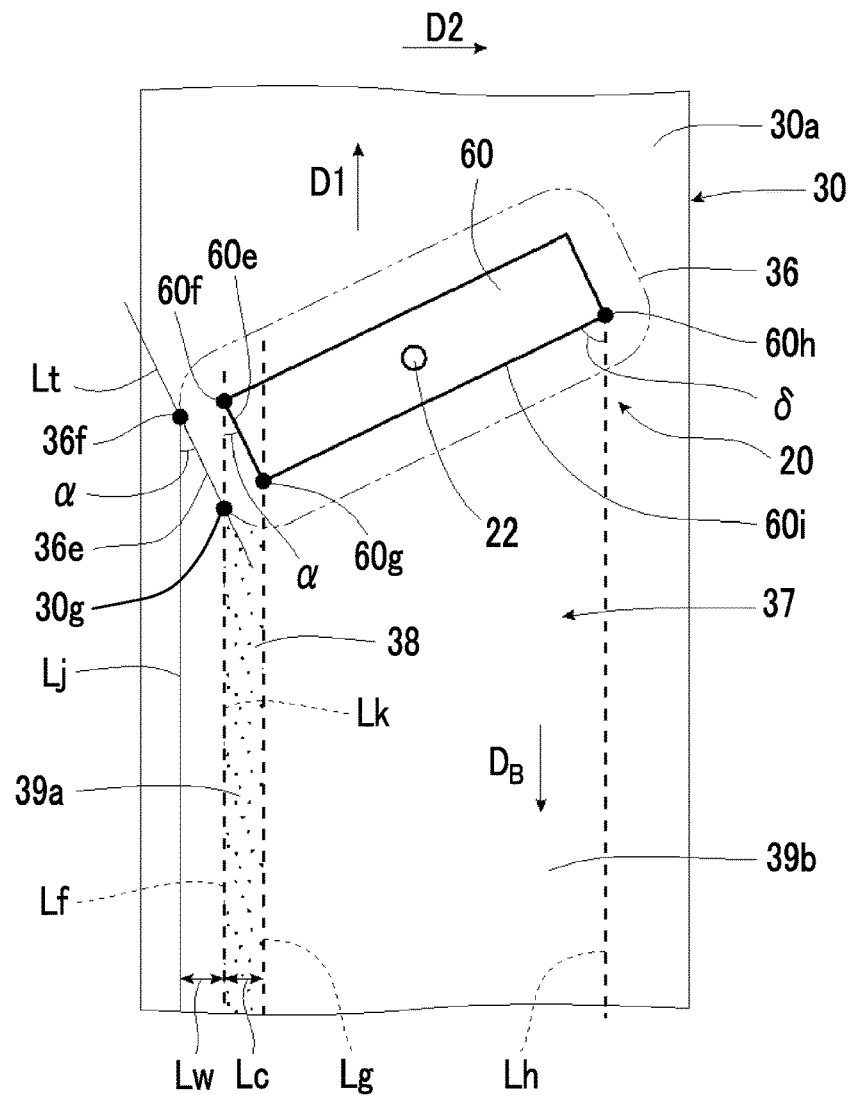
FIG. 18 is a plan view for describing the other method of manufacturing a film according to the embodiment of the present invention.

FIG. 17 is a schematic cross-sectional view illustrating the other method of manufacturing a film according to the embodiment of the present invention, and FIG. 18 is a plan view for describing the other method of manufacturing a film according to the embodiment of the present invention.

In FIGS. 17 and 18, the same components as illustrated in FIGS. 5 and 6 are denoted by the same reference numerals, and detailed descriptions thereof are omitted.

Also in the method of manufacturing another film, for example, the manufacturing device 10 illustrated in FIG. 1 described above is used. The coating head 20 used in the other method of manufacturing a film is described.

The coating head 20 has the coating blade 60 formed of a narrow and long flat plate elongating in the second direction D2 as illustrated in FIGS. 17 and 18. A blade surface 60a of the coating blade 60 is a planar surface. The blade surface 60a of the coating blade 60 is disposed so as to be parallel to the substrate surface 30a and spaced from the substrate surface 30a, and there is a clearance between the blade surface 60a and the substrate surface 30a. This clearance is a gap G. The liquid reservoir 34 is formed between the coating blade 60 and the substrate surface 30a. In FIG. 17, the solutions 36 protrude from the coating blade 60, but may not protrude.

For example, in the coating blade 60, a tilted portion 60e of the coating blade 60 is disposed to be tilted by the tilt angle $\alpha$ with respect to the first direction D1 in the plane P (see FIG. 10) parallel to the substrate surface 30a described above, and a tilted portion 60i is disposed to be tilted by the tilt angle $\delta$ with respect to the first direction D1 in the plane P (see FIG. 10) parallel to the substrate surface 30a described above. The coating blade 60 has two of the tilted portions 60e and 60i tilted with respect to the first direction D1 in the plane P (see FIG. 10) parallel to the substrate surface 30a described above, and all of these are formed with tilted surfaces tilted with respect to the first direction D in the plane P (see FIG. 10) parallel to the substrate surface 30a described above.

In the coating blade 60, in the same manner as in the coating blade 32 illustrated in FIG. 6, for example, the film forming area 37 is formed with two of the tilted portion 60e and the tilted portion 60i, and the film can be formed with two of the tilted portion 60e and the tilted portion 60i. The tilt angle α of the tilted portion 60e is smaller than the tilt angle δ of the tilted portion 60i.

In a case where the solutions 36 do not protrude from the coating blade 60, the film forming area 37 of the coating blade 60 is a range between the straight line Lf that passes through a vertex 60f of the coating blade 60 and that is parallel in the first direction D1 illustrated in FIG. 18 and the straight line Lh that passes through a vertex 60h of the coating blade 60 and that is parallel in the first direction D1.

In the coating blade 60, the film 38 is formed in the range between the straight line Lg that passes through a vertex 60g of the tilted portion 60e and the straight line Lf parallel in the first direction D1. That is, the high quality film 38 is formed in the tilted portion 60e. In the same manner as in the coating blade 32 described above, it is checked that a high quality film is hardly obtained in the tilted portion 60i. That is, a high quality film is hardly obtained in the range between the straight line Lg and the straight line Lh.

Also in the coating blade 60, it is preferable that all of the upper limits and the lower limits of the tilt angle α and the tilt angle δ are the same as the upper limit and the lower limit of the tilt angle α. At least the smaller tilt angle of two of the tilted portions 60e and 60i is preferably 45° or less.

A length d of the gap G is a length between the substrate surface 30a and the blade surface 60a of the coating blade 60. As described above, it is preferable that the length d of the gap G is 100 μm or less, since the generation of the vibration of the solutions 36 in the liquid reservoir 34 can be suppressed, and the moving speed of the coating blade 32 can be increased.

The length d of the gap G is measured by the amount of raising the carriage 27 from a state in which the coating blade 60 is in contact with the substrate surface 30a. In a case where a micrometer (not illustrated) for height adjustment is provided to the carriage 27, the length d of the gap G may be measured.

More specifically, a digital image including the substrate 30 is obtained from the side surface of the coating blade 60, this digital image is stored in a computer, and a length between the substrate surface 30a and the corner portion 32d of the coating blade 60 is measured on the computer based on the digital image.

In a case of forming the film 38, the substrate 30 is moved in the first direction D1 in a state in which the coating head 20 is in contact with the various kinds of solutions 36. In order to form the film 38, the substrate 30 may be moved in the direction $D_B$ in a state in which the coating head 20 is in contact with the various kinds of solutions 36.

The crystal growth portion Cg of the various kinds of solutions 36 is a region that becomes a starting point for forming the film 38, and is a region where a liquid surface 36a (see FIG. 17) of the various kinds of solutions 36 is in contact with the substrate surface 30a on a $D_B$ direction side of the liquid reservoir 34.

With respect to the crystal growth portion Cg, a digital image including the liquid reservoir 34 and the film 38 are obtained, this digital image is stored in a computer, a portion near the boundary of the liquid reservoir 34 and the film 38 is visually observed based on this digital image, so as to specify the crystal growth portion Cg.

The other method of manufacturing a film is described.

The coating head 20 is disposed by providing the gap G by using the manufacturing device 10 (see FIG. 1). At this point, the coating blade 60 is tilted by the tilt angle α with respect to the first direction D1 in the plane P (see FIG. 10) parallel to the substrate surface 30a described above.

Subsequently, the various kinds of solutions 36 are supplied from the supply portion 24 to a portion between the substrate surface 30a and the blade surface 60a of the coating blade 60 via the supply pipe 22, and the liquid reservoir 34 is formed between the blade surface 60a of the coating blade 60 and the substrate surface 30a. At this point, the temperature of the substrate 30 is a temperature that is predetermined by the temperature controller 16.

While the various kinds of solutions 36 are supplied to a portion between the blade surface 60a of the coating blade 60 of the coating head 20 and the substrate surface 30a, that is, the liquid reservoir 34, as illustrated in FIG. 18, the blade surface 60a of the coating blade 60 of the coating head 20 is moved to the substrate 30 in the first direction D1 at a predetermined moving speed in a state of being in contact with the various kinds of solutions 36. Accordingly, by using the crystal growth portion Cg of the various kinds of solutions 36 as a starting point, the film 38 is formed sequentially from the crystal growth portion Cg. In this manner, in the same direction as the direction $D_F$ in which the coating blade 60 of the coating head 20 moves, that is, the various kinds of solutions 36 are applied in the direction $D_F$, and the film 38 is formed in the direction $D_F$. At this point, as illustrated in FIG. 18, in the width Lc corresponding to the tilted portion 60e of the coating blade 60 of the solutions 36, it is possible to obtain the high quality film 38 in the same manner as in the coating blade 32 described above.

In a case where the film 38 is continuously formed, as described above, even in a case where the moving speed of the coating head 20 or the substrate 30 is increased, the high quality film 38 can be continuously obtained.

The supply amount of the various kinds of solutions 36 is appropriately determined according to the temperature and the moving speed of the substrate 30 and the size of the film 38 to be formed.

Also in this case, the coating head 20 may be moved in the first direction D1, and the substrate 30 may be moved in the direction $D_B$ at a predetermined moving speed.

In a case of forming the film 38, in a case where the solutions 36 protrude from the coating blade 60, the tangent line Lt of the outer peripheral end portion 36e corresponding to the tilted portion 60e of the coating blade 60 of the solutions 36 is tilted by the tilt angle α with respect to the first direction D1 in the plane P (see FIG. 10) parallel to the substrate surface 30a described above, and the outer peripheral end portion 36e is tilted with respect to the first direction D1 in the plane P (see FIG. 10) parallel the substrate surface 30a described above. Even in a case where the solutions 36 protrude from the coating blade 60, the high quality film 38 is formed in the same manner as in the coating blade 32 in the range of the width Lw between the straight line Lj and the straight line Lk as described above using the tilted outer peripheral end portion 36e as a starting point. Also in this case, the width Lw corresponds to the width Lc. The protrusions of the solutions 36 from the coating blade 60, for example, can be visually checked and can be realized by increasing the supply amount of the solutions 36.

In a case where the coating blade 60 is used, in the step of manufacturing the film 38, the temperature Ts of the substrate surface 30a of the substrate 30 is maintained preferably at the temperature satisfying Tb−50° C.≤Ts≤Tb. In a case where the temperature Ts is in this temperature range, the film formation speed of the film 38 may be increased, so as to increase the productivity of the film 38. The temperature Ts of the substrate 30 in a case of forming the film 38 is more preferably at the temperature satisfying Tb−40° C.≤Ts≤Tb.

The coating blade 60 can be also formed to be tilted with respect to at least one direction of the first direction D1, the second direction D2, or the third direction D3 in the plane P parallel to the substrate surface 30a illustrated in FIG. 10 in the same manner as in the coating blade 32, and in this case, the same effect as in the coating blade 32 described above can be obtained.

Figure 19:
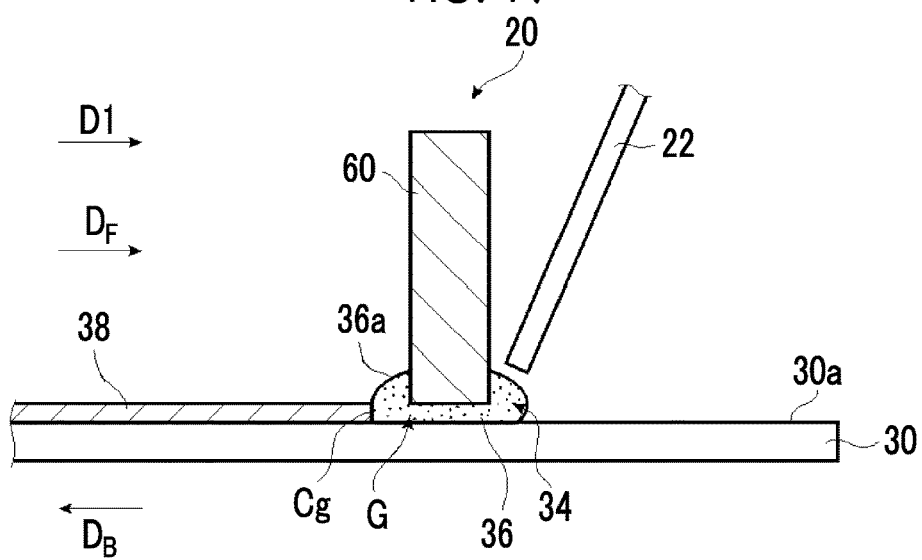
FIG. 19 is a schematic cross-sectional view illustrating a first example of a disposition position of a supply pipe in the coating head of the manufacturing device of the film according to the embodiment of the present invention.
Figure 20:
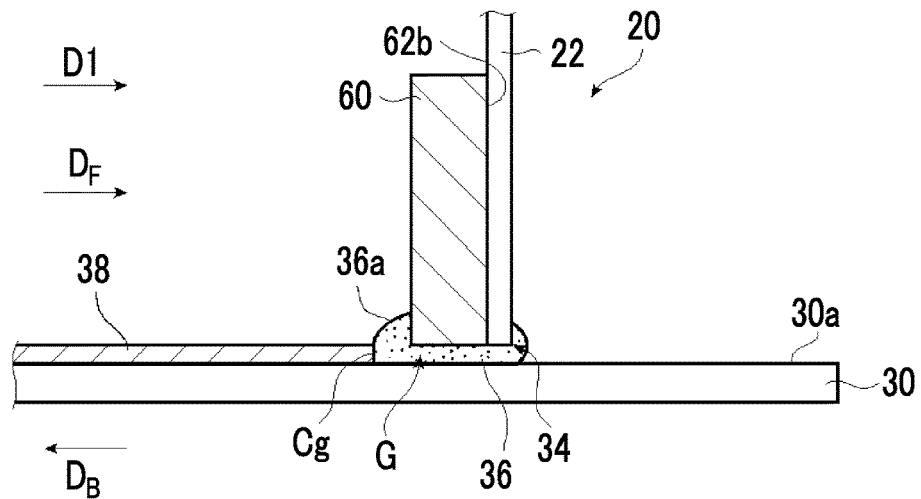
FIG. 20 is a schematic cross-sectional view illustrating a second example of the disposition position of the supply pipe in the coating head of the manufacturing device of the film according to the embodiment of the present invention.

FIG. 19 is a schematic cross-sectional view illustrating a first example of a disposition position of a supply pipe in the coating head of the manufacturing device of the film according to the embodiment of the present invention, and FIG. 20 is a schematic cross-sectional view illustrating a second example of the disposition position of the supply pipe in the coating head.

In the coating head 20, the supply pipe 22 penetrates the coating blade 60 as illustrated in FIG. 18, but the present invention is not limited thereto. As illustrated in FIG. 19, without providing the supply pipe 22 to the coating blade 60, the supply pipe 22 may be disposed on an opposite side to the crystal growth portion Cg of the coating blade 60. The supply pipe 22 may be disposed on the crystal growth portion Cg side of the coating blade 60.

As illustrated in FIG. 20, without providing the supply pipe 22 on the coating blade 60, the supply pipe 22 may be disposed on a side surface 62b on an opposite side to the crystal growth portion Cg of the coating blade 60. Also in the case illustrated in FIG. 20, the supply pipe 22 may be disposed on the side surface on the crystal growth portion Cg side of the coating blade 60.

The number of dispositions of the supply pipes 22 is not limited to one as described above, and a plurality of supply pipes 22 may be provided, and the number is appropriately determined according to the size of the coating head 20, the size of film 38, or the like.

Figure 21:
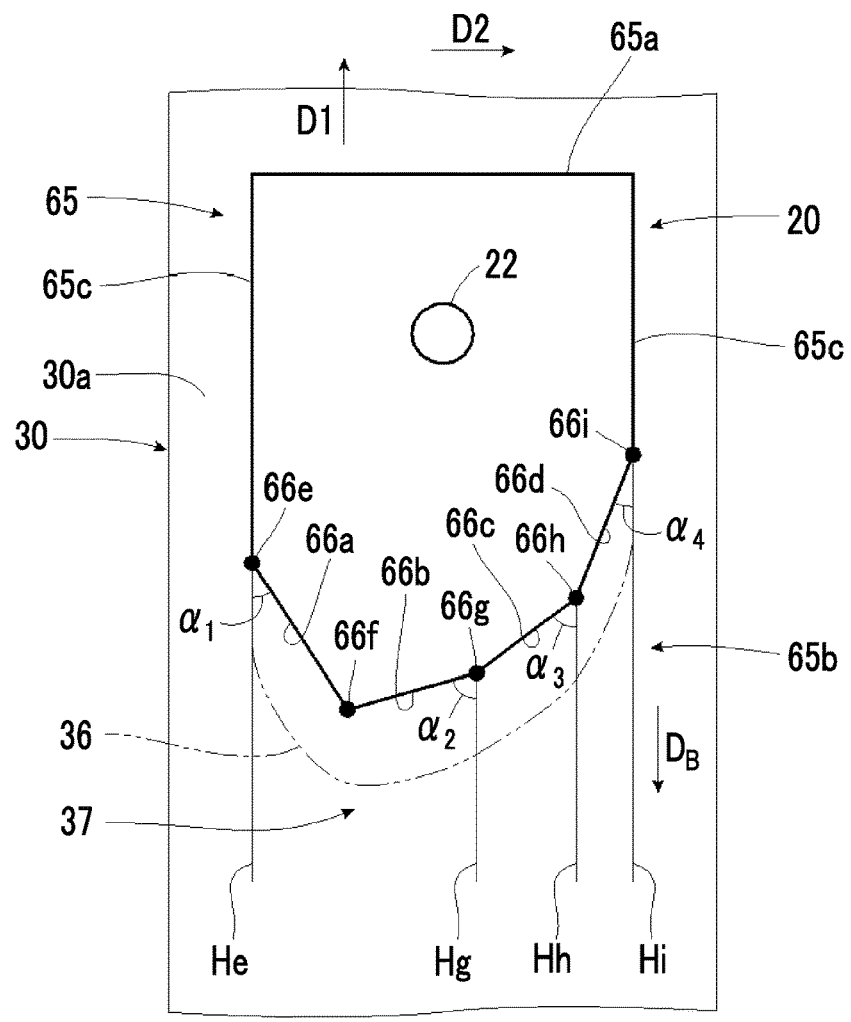
FIG. 21 is a schematic view illustrating another example of the coating blade of the coating head.

FIG. 21 is a schematic view illustrating another example of the coating blade of the coating head.

In FIG. 21, the same components as illustrated in FIGS. 5 and 6 are denoted by the same reference numerals, and detailed descriptions thereof are omitted.

In a coating blade 65 of the coating head 20, an end portion 65a on a progression direction side of the first direction D1 is a side parallel to the second direction D2. For example, four tilted portions 66a to 66d tilted with respect to the first direction D1 in the plane P (see FIG. 10) parallel to the substrate surface 30a described above are provided in the end portion 65b on the opposite side to the end portion 65a. A side surface 65c of the coating blade 65 is parallel in the first direction D1. In the coating blade 65, the film forming area 37 is formed with four tilted portions 66a to 66d. In FIG. 21, a range from a straight line He to a straight line Hi described below is the film forming area 37. Reference numerals 66e, 66f, 66g, 66h, and 66i of FIG. 21 indicate vertexes of the tilted portions of 66a to 66d.

A tilt angle of the tilted portion 66a is $\alpha_1$, a tilt angle of the tilted portion 66b is $\alpha_2$, a tilt angle of the tilted portion 66c is $\alpha_3$, and a tilt angle of the tilted portion 66d is $\alpha_4$. The relationship between sizes of the angles of the tilt angles $\alpha_1$ to $\alpha_4$ satisfies $\alpha_4 < \alpha_1 < \alpha_3 < \alpha_2$.

In the coating blade 65, in any one of the four tilted portions 66a to 66d, the film can be formed. However, in order to obtain a film with the satisfactory film quality, it is preferable to continuously form the film in the tilted portion 66d having the minimum tilt angle among the four tilted portions 66a to 66d. A high quality film may be formed only with the tilted portion 66d.

In the coating blade 65, the tilted portion 66a, the tilted portion 66b, the tilted portion 66c, and the tilted portion 66d are respectively different tilt angles, but the tilted portion 66a, the tilted portion 66b, the tilted portion 66c, and the tilted portion 66d may have the same tilt angle.

All of the upper limits and the lower limits of the tilt angle $\alpha_1$ to $\alpha_4$ are preferably the same as the upper limit and the lower limit of the tilt angle $\alpha$. Among the four of the tilted portions 66a to 66d, it is preferable that at least the minimum tilt angle is 45° or less, and all of the tilt angles may be 45° or less.

The tilt angle $\alpha_1$ is an angle formed by the straight line He that passes through a vertex 66e and that is parallel to the first direction D1 and the tilted portion 66a. The tilt angle $\alpha_2$ is an angle formed by a straight line Hg that passes through a vertex 66g and that is parallel to the first direction D1 and the tilted portion 66b. The tilt angle $\alpha_3$ is an angle formed by a straight line Hh that passes through a vertex 66h and that is parallel to the first direction D1 and the tilted portion 66c. The tilt angle $\alpha_4$ is an angle formed by a straight line Hi that passes through a vertex 66i and that is parallel to the first direction D1 and the tilted portion 66d.

Figure 22:
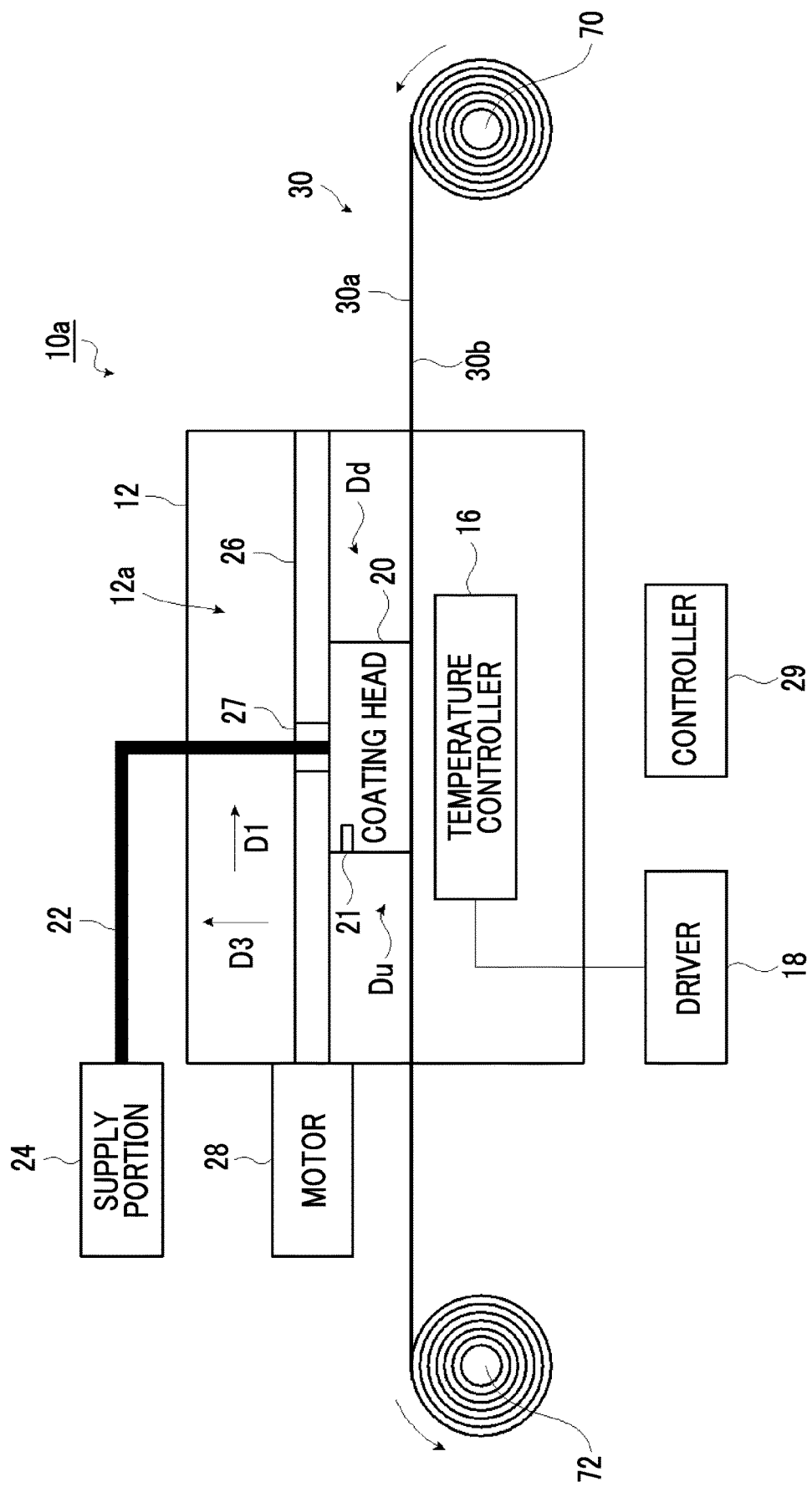
FIG. 22 is a schematic view illustrating another example of the manufacturing device used in the method of manufacturing a film according to the embodiment of the present invention.

The manufacturing device 10 is a single wafer type, but the method of manufacturing a film is not limited to the single wafer type and may be a roll to roll method as in a manufacturing device 10a as illustrated in FIG. 22.

With respect to the manufacturing device 10a of FIG. 22, the same components as in the manufacturing device 10 illustrated in FIG. 1 are denoted by the same reference numerals, and detailed descriptions thereof are omitted.

The manufacturing device 10a illustrated in FIG. 22 is different from the manufacturing device 10 of FIG. 1, in that the stage 14 is not provided, a transport form of the substrate 30 is stretched to an unwinding roller 70 and a winding roller 72, the coating head 20 having a coating blade is disposed on the substrate surface 30a side of the substrate 30 as described below, and the temperature controller 16 is disposed on the back surface 30b side, and the other configuration is the same as that in the manufacturing device 10 illustrated in FIG. 1.

In the manufacturing device 10a of FIG. 22, the temperature of the substrate surface 30a of the substrate 30 in the temperature controller 16 becomes a predetermined temperature, and the film 38 is formed by the coating blade 32 (see FIG. 2) of the coating head 20. In a case where the film 38 is formed, the coating blade 32 (see FIG. 2) may be moved, and the substrate 30 may be transported by being wound with the winding roller 72.

The various kinds of solutions 36 for forming the film is a solution including a material having aligning properties. The solution including a material having aligning properties, for example, is a solution including a material for forming a crystal or a solution including an organic semiconductor. The organic semiconductor may be not only a transistor but also an organic solar cell material. Examples of the material having crystallinity include an organic ferroelectric material such as croconic acid and an imidazole compound and a gas sensor material such as a pyrroleimine-naphthalene diimide (PI-NDI) compound.

Hereinafter, a solution including an organic semiconductor is specifically described with reference to examples. Generally, at least an organic semiconductor (organic semiconductor compound) and a solvent are included in a solution including an organic semiconductor.

The types of the organic semiconductor are not particularly limited, and well-known organic semiconductors may be used. Specific examples thereof include pentacenes such as 6,13-bis(triisopropylsilylethynyl) pentacene (TIPS pentacene), tetramethyl pentacene, and perfluoropentacene, anthradithiophenes such as 5,11-bis(triethylsilylethynyl) anthradithiophene (TES-ADT) and 2,8-difluoro-5,11-bis(triethylsilylethynyl) anthradithiophene (diF-TES-ADT), benzothienobenzothiophenes such as 2,7-diphenyl[1]benzothieno[3,2-b][1]benzothiophene (DPh-BTBT) and benzothienobenzothiophene (Cn-BTBT), dinaphthothienothiophenes such as 3,11-didecyl-dinaphtho[2,3-d:2',3'-d']-benzo[1,2-b:4,5-b']dithiophene (C10-DNBDT) and dinaphtho[2,3-b:2',3'-f]thieno[3,2-b]thiophene (Cn-DNTT), dioxaanthanthrenes such as perixanthenoxanthene, rubrenes, fullerenes such as C60 and [6,6]-phenyl-C61-butyric acid methyl ester (PCBM), phthalocyanines such as copper phthalocyanine and fluorinated copper phthalocyanine, polythiophenes such as poly(3-alkylthiophene) (P3RT), poly[5,5'-bis(3-dodecyl-2-thienyl 1)-2,2'-bithiophen] (PQT), and poly(3-hexylthiophene) (P3HT), and polythienothiophenes such as poly[2,5-bis(3-dodecylthiophene-2-yl)thieno[3,2-b]thiophene](PBTTT).

The types of the solvent are not particularly limited, and examples thereof include an alcohol-based solvent such as methanol and ethanol; a ketone-based solvent such as acetone, methyl ethyl ketone, and methyl isobutyl ketone; an aromatic solvent such as benzene and thiophene; halogen (chlorine, bromine, and the like) substitution products (halogenated aromatic solvents) thereof; an ether-based solvent such as tetrahydrofuran and diethyl ether; an amide-based solvent such as dimethylformamide and dimethylacetamide; and a sulfonic acid-based solvent such as dimethyl sulfoxide and sulfolane.

The present invention basically has the configuration as above. In the above, the method of manufacturing a film of the present invention is been described, but the present invention is not limited to the above embodiments, and it is obvious that various improvements and modifications may be performed in the range without departing from the gist of the present invention.

EXAMPLES

Example 1

Hereinafter, the present invention is specifically described with reference to the examples. A material, a reagent, an amount used, an amount of a material, a proportion, a treatment detail, a treatment order, and the like provided in the following examples may be suitably changed without departing from the gist of the present invention. The scope of the present invention should not be construed in a limited manner by the following specific examples.

In the present examples, the organic semiconductor layer formed with the organic semiconductor film was formed by using the method of manufacturing a film so as to obtain thin film transistors of Examples 1 to 10 and Comparative Examples 1 and 2. With respect to the thin film transistors of Examples 1 to 10 and Comparative Examples 1 and 2, thin film transistor element characteristics were evaluated.

The thin film transistor was manufactured as described below so as to have a channel width W of 1 mm and a channel length L of 50 μm by using the bottom gate and top contact-type thin film transistor 40 illustrated in FIG. 7.

First, after a glass substrate was washed, a gate pattern was manufactured by vacuum evaporation using a metal mask. Chromium (Cr) with a thickness of 10 nm was deposited as an adhesive layer, and then a gate electrode having a thickness of 40 nm was formed by using silver (Ag).

Subsequently, a polyimide insulating film having a thickness of 0.5 μm was formed by being applied on the glass substrate using spin coating and being cured.

Subsequently, the glass substrate was provided on a hot plate on the stage, the temperature of the substrate surface was set to 120° C. which was a predetermined temperature of the substrate surface, the solution was applied at a predetermined moving speed (mm/min), and an organic semiconductor film was formed, so as to obtain an organic semiconductor layer.

In the solution, C4-TBBT (thieno[3,2-f:4,5-f']bis[1]benzothiophene) was used as an organic semiconductor and anisole was used as a solvent. The solution was heated and dissolved in anisole such that the concentration of the organic semiconductor described above was 0.1 mass %.

After the coating head having the coating blade provided above the substrate was fixed at a predetermined height and the predetermined tilt angle α illustrated in FIGS. 23 to 28, the solution described above was supplied, so as to form a liquid reservoir. The supply amount of the solution described above was adjusted according to the moving speed presented in Table 1 below so that the size of the liquid reservoir did not change during coating. The tilt angle α was as described above.

Subsequently, gold (Au) films having a thickness of 70 nm were formed as source and drain electrodes on the organic semiconductor layer by a vacuum evaporation method using a metal mask.

The width of the organic semiconductor film varies depending on the tilt angle α, the width was 5 cm×sin α, and the length was 10 cm.

The thin film transistor was manufactured in the center of the organic semiconductor film, that is, in the center (2.5 cm×sin α) in the width direction and at the position of 5 cm in the length direction.

In the present examples, the coating blade 80 was disposed as illustrated in FIGS. 23 to 28, and the tilt angle was set as the predetermined tilt angle α. In FIGS. 23 to 28, the same components as illustrated in FIG. 6 are denoted by the same reference numerals, and detailed descriptions thereof are omitted. At this point, the coating blade 80 had a first tilted portion 80a and a second tilted portion 80b that were tilted with respect to the first direction D1 in the plane P (see FIG. 10) parallel to the substrate surface 30a described above. All of the first tilted portion 80a and the second tilted portion 80b are formed with tilted surfaces.

Figure 23:
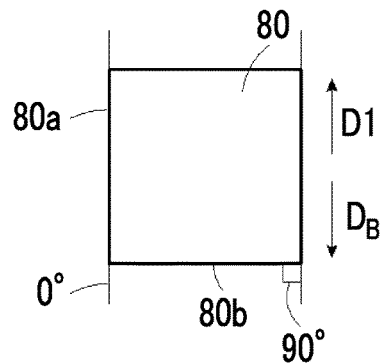
FIG. 23 is a schematic view illustrating a coating blade in which a tilt angle of a first tilted portion is 0°, and a tilt angle of a second tilted portion is 90°.
Figure 24:
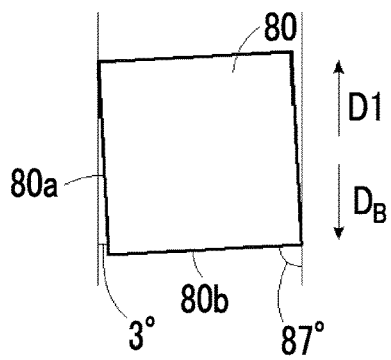
FIG. 24 is a schematic view illustrating a coating blade in which the tilt angle of the first tilted portion is 3°, and the tilt angle of the second tilted portion is 87°.
Figure 25:
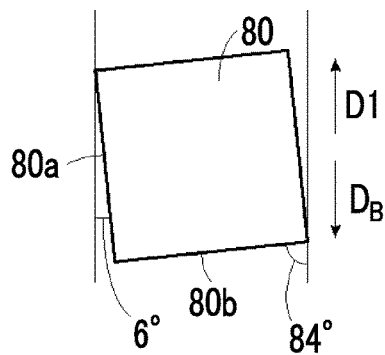
FIG. 25 is a schematic view illustrating a coating blade in which the tilt angle of the first tilted portion is 6°, and the tilt angle of the second tilted portion is 84°.
Figure 26:
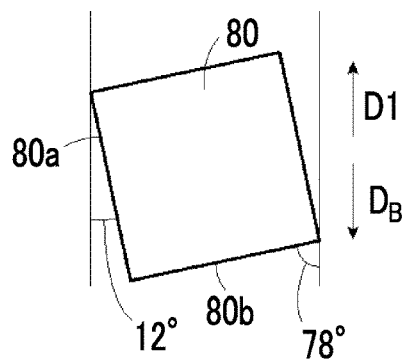
FIG. 26 is a schematic view illustrating a coating blade in which the tilt angle of the first tilted portion is 12°, and the tilt angle of the second tilted portion is 78°.
Figure 27:
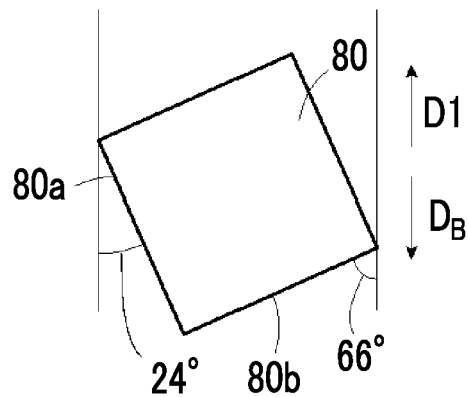
FIG. 27 is a schematic view illustrating a coating blade in which the tilt angle of the first tilted portion is 24°, and the tilt angle of the second tilted portion is 66°.
Figure 28:
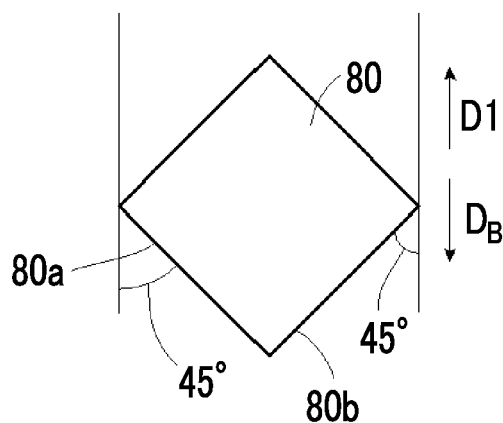
FIG. 28 is a schematic view illustrating a coating blade in which the tilt angle of the first tilted portion is 45°, and the tilt angle of the second tilted portion is 45°.

FIG. 23 is a schematic view illustrating the coating blade 80 in which the tilt angle α of the first tilted portion 80a is 0°, and the tilt angle δ of the second tilted portion 80b is 90°, and FIG. 24 is a schematic view illustrating the coating blade 80 in which the tilt angle α of the first tilted portion 80a is 3°, and the tilt angle δ of the second tilted portion 80b is 87°. FIG. 25 is a schematic view illustrating the coating blade 80 in which the tilt angle α of the first tilted portion 80a is 6°, and the tilt angle δ of the second tilted portion 80b is 84°, and FIG. 26 is a schematic view illustrating the coating blade 80 in which the tilt angle α of the first tilted portion 80a is 12°, and the tilt angle δ of the second tilted portion 80b is 78°. FIG. 27 is a schematic view illustrating the coating blade 80 in which the tilt angle α of the first tilted portion 80a is 24°, and the tilt angle δ of the second tilted portion 80b is 66°, and FIG. 28 is a schematic view illustrating the coating blade 80 in which the tilt angle α of the first tilted portion 80a is 45°, and the tilt angle δ of the second tilted portion 80b is 45°.

In the coating blade 80 illustrated in FIG. 23 in which the tilt angle α of the first tilted portion 80a is 0°, and the tilt angle δ of the second tilted portion 80b is 90°, an organic semiconductor film in the second tilted portion 80b of the coating blade 80 is formed. In the coating blade 80 illustrated in FIGS. 24 to 28, in which the tilt angle α of the first tilted portion 80a is greater than 0°, an organic semiconductor film is formed in the first tilted portion 80a and the second tilted portion 80b of the coating blade 80. In Table 1 below, the first tilted portion 80a is referred to as a first coated surface, and the second tilted portion 80b is referred to as a second coated surface. The tilt angle δ of the second tilted portion 80b is 90°-(the tilt angle α of the first tilted portion 80a).

In the coating blade, a glass plate having the size of 50 mm×50 mm was used regardless of the tilt angle α. In this case, the size of the solution storing portion is 50 mm×50 mm. The blade surface of the coating blade and the substrate surface of the substrate were disposed in parallel, and the distance between the blade surface and the substrate surface was set to 100 μm. A through pipe for supplying the solution was provided in the center portion of the coating blade, and the supply amount of the solution was adjusted such that the solution amount in the solution did not change.

In Examples 1 to 5 and Comparative Example 1, the solution was in a state of protruding the solution storing portion of the coating blade 80. In Examples 6 to 10 and Comparative Example 2, the solution was in a state of not protruding the solution storing portion of the coating blade 80 and being stored on the entire surface of the coating blade. Whether there were protrusions of the solutions was visually checked.

With respect to the characteristics of the thin film transistor element, the saturation mobility of the manufactured thin film transistor was measured by using a semiconductor parameter analyzer (4155C manufactured by Agilent). The characteristics of the thin film transistor element are presented as "TFT characteristics" in Table 1 below.

Based on the measured saturation mobility μ, the characteristics of the thin film transistor element were evaluated with the following evaluation standard.

a Saturation mobility μ was 1.0 cm²/Vs or more
b Saturation mobility μ was 0.5 cm²/Vs or more and less than 1.0 cm²/Vs
c Saturation mobility μ was 0.01 cm²/Vs or more and less than 0.5 cm²/Vs
d Saturation mobility μ was less than 0.01 cm²/Vs

TABLE 1

| Moving speed (mm/min) | Comparative Example 1 First coating surface Tilt angle 0° | Comparative Example 1 Second coating surface Tilt angle 90° | Example 1 First coating surface Tilt angle 3° | Example 1 Second coating surface Tilt angle 87° | Example 2 First coating surface Tilt angle 6° | Example 2 Second coating surface Tilt angle 84° | Example 3 First coating surface Tilt angle 12° | Example 3 Second coating surface Tilt angle 78° | Example 4 First coating surface Tilt angle 24° | Example 4 Second coating surface Tilt angle 66° | Example 5 First coating surface Tilt angle 45° | Example 5 Second coating surface Tilt angle 45° |
|---|---|---|---|---|---|---|---|---|---|---|---|---|
| 1 | None | a | a | a | a | a | a | a | a | a | a | a |
| 2.2 | None | b | a | a | a | a | a | a | a | a | a | a |
| 3 | None | b | a | b | a | b | a | b | a | b | a | a |
| 5 | None | b | a | b | a | b | a | b | a | b | b | b |
| 10 | None | d | a | d | a | d | a | d | b | d | d | d |
| 15 | None | d | a | d | a | d | b | d | d | d | d | d |
| 20 | None | d | a | d | a | d | b | d | d | d | d | d |
| 50 | None | d | b | d | d | d | d | d | d | d | d | d |
| 100 | None | d | d | d | d | d | d | d | d | d | d | d |

| Moving speed (mm/min) | Comparative Example 2 First coating surface Tilt angle 0° | Comparative Example 2 Second coating surface Tilt angle 90° | Example 6 First coating surface Tilt angle 3° | Example 6 Second coating surface Tilt angle 87° | Example 7 First coating surface Tilt angle 6° | Example 7 Second coating surface Tilt angle 84° | Example 8 First coating surface Tilt angle 12° | Example 8 Second coating surface Tilt angle 78° | Example 9 First coating surface Tilt angle 24° | Example 9 Second coating surface Tilt angle 66° | Example 10 First coating surface Tilt angle 45° | Example 10 Second coating surface Tilt angle 45° |
|---|---|---|---|---|---|---|---|---|---|---|---|---|
| 1 | None | a | a | a | a | a | a | a | a | a | a | a |
| 3 | None | a | a | a | a | a | a | a | a | a | a | a |
| 5 | None | a | a | a | a | a | a | a | a | a | a | a |
| 10 | None | a | a | a | a | a | a | a | a | a | a | a |
| 11 | None | b | a | a | a | a | a | a | a | a | a | a |
| 15 | None | b | a | b | a | b | a | b | a | b | a | a |
| 20 | None | b | a | b | a | b | a | b | a | b | b | b |
| 50 | None | d | a | d | a | d | a | d | b | d | d | d |
| 100 | None | d | a | d | a | d | b | d | d | d | d | d |
| 150 | None | d | a | d | b | d | d | d | d | d | d | d |

As illustrated in Table 1, in Examples 1 to 5 and Comparative Example 1, in Comparative Example 1, TFT characteristics were decreased in a case where the moving speed became 2.2 mm/min. Meanwhile, in Examples 1 to 5, on the first coated surface, TFT characteristics were satisfactory even in a case where the moving speed was 3 mm/min. In Examples 6 to 10 and Comparative Example 2, in Comparative Example 2, TFT characteristics were decreased in a case where the moving speed became 11 mm/min. Meanwhile, in Examples 6 to 10, on the first coated surface, TFT characteristics were satisfactory even in a case where the moving speed was 15 mm/min. As the tilt angle α was smaller, the moving speed was able to be increased. By tilting the coating blade in this manner, even in a case where the moving speed was increased, it was able to obtain a thin film transistor with satisfactory TFT characteristics. That is, the high quality film was able to be formed with high productivity.

Example 2

Figure 29:
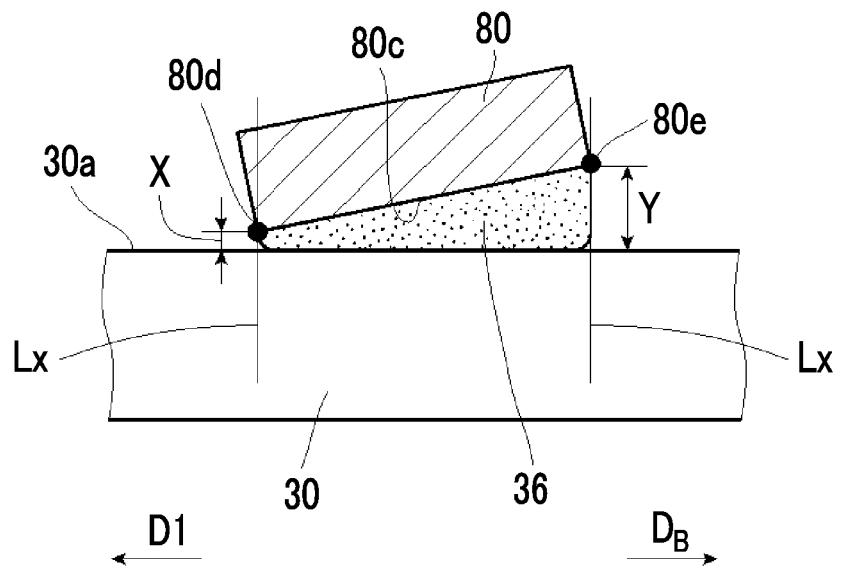
FIG. 29 is a schematic cross-sectional view illustrating a disposition state of the coating blade and the substrate.

In the second example, based on Examples 11 to 22 in which a distance X and a distance Y between a blade surface 80c of the coating blade 80 and the substrate surface 30a illustrated in FIG. 29 were set as presented in Table 2 below, organic semiconductor films were formed. In the coating blade 80, the tilt angle α of the first tilted portion 80a was set as 6°, and the tilt angle δ of the second tilted portion 80b was set as 84°. The moving speed was set as 150 mm/min. In addition to the above, the organic semiconductor film was formed in the same manner as in the first example, and thus the detailed descriptions thereof are omitted.

The distance X is a length of a straight line Lx that passed through an end portion 80d on the first direction D1 side and that is perpendicular to the substrate surface 30a from the substrate surface 30a to the end portion 80d. The distance Y is a length of a straight line Ly that passes through an end portion 80e on the direction $D_B$ side and is perpendicular to the substrate surface 30a from the substrate surface 30a to the end portion 80e.

In Examples 11 to 22, an organic semiconductor film was formed in a state in which the solutions did not protrude the solution storing portion of the coating blade and was stored on the entire surface of the coating blade. Whether there were protrusions of the solutions was visually checked.

In Table 2 below, for comparison, the result of "Comparative Example 2" of the first example at the moving speed of 150 mm/min described above was presented in a combined manner. The results of "TFT characteristics" of Examples 11 to 22 of Table 2 below were the same as the results of "TFT characteristics" of the first coated surface of the first tilted portion in which the tilt angle α was 6°.

TABLE 2

| Tilt angle 6° and 84° Substrate transportation speed: 150 mm/min | Distance X (μm) | Distance Y (μm) | TFT characteristics |
|---|---|---|---|
| Example 11 | 50 | 50 | b |
| Example 12 | 100 | 100 | b |
| Example 13 | 200 | 200 | c |
| Example 14 | 300 | 300 | c |
| Example 15 | 50 | 1050 | a |
| Example 16 | 100 | 1100 | a |
| Example 17 | 200 | 1200 | c |
| Example 18 | 300 | 1300 | c |
| Example 19 | 1050 | 50 | a |
| Example 20 | 1100 | 100 | a |
| Example 21 | 1200 | 200 | c |
| Example 22 | 1300 | 300 | c |
| Comparative Example 2 (Tilt angle 0° and 90°) | 100 | 100 | d |

As presented in Table 2, in a case where the coating blade was tilted, in a case where the moving speed was as fast as 150 mm/min, even in a case where the blade surface and the substrate surface were parallel to each other or the blade surface was tilted to the substrate surface, a thin film transistor having satisfactory TFT characteristics was able to be obtained compared with Comparative Example 2. That is, the high quality film was able to be formed with high productivity. With respect to the tilt of the blade surface to the substrate surface, even in a case where the distance Y was great as in Examples 15 to 18, and even in a case where the distance X was great as in Examples 19 to 22, in a case where the distance was the same, the same result was able to be obtained.

As in Examples 11, 12, 15, 16, 19, and 20, in a case where a minimum distance to the substrate was 100 μm or less, a high quality film was able to be formed. As in Examples 15, 16, 19, and 20, in a case where the maximum distance to the substrate was greater than 1,050 μm, a higher quality film was able to be formed.

EXPLANATION OF REFERENCES 10, 10a: manufacturing device
12: casing
12a: inside portion
14: stage
16: temperature controller
18: driver
20: coating head
21: sensor
22: supply pipe
22a: supply port
24: supply portion
26: guide rail
27: carriage
28: motor
29: controller
30, 42: substrate
30a: substrate surface
30b: back surface
32, 50, 52, 60, 65, 80, 100: coating blade
32a, 60a, 80c: blade surface
32c: location
32d: corner portion
32e, 32i, 60e, 60f, 60g, 60h, 60i, 66a, 66b, 66c, 66d: tilted portion
32f, 32g, 32h, 66e, 66f, 66g, 6611, 66i: vertex
33: open portion
34: liquid reservoir
36 solution
36a: liquid surface
36e: outer peripheral end portion
36f, 36g: end point
38: film 39a, 39b: range
40: thin film transistor
42a, 44a, 46a: surface
43: gate electrode
44: insulating film
46: organic semiconductor layer
48a: source electrode
48b: drain electrode
50e, 52e: oblique side
62b, 65c: side surface
65a, 65b: end portion
70: unwinding roller
72: winding roller
80a: first tilted portion
80b: second tilted portion
80d, 80e: end portion
100e: side
102 alignment film
Cg: crystal growth portion
$d_1, d_2$: size
$d_3$: distance
$D_0, D\alpha$: alignment direction
D1: first direction
D2: second direction
D3: third direction
$D_B$: direction
$D_F$: direction
Dd: downstream side
Du: upstream side
G: gap
$G_1$: first gap
$G_2$: second gap
He, Hg, Hh, Hi: straight line
L: channel length
La: straight line
Lc, Lw: width
Lf, Lg, Lh, Lj, Lk, Lx, Ly: straight line
Lt: tangent line
P: plane
W: channel width
α, δ: tilt angle
θ: vertical tilt angle

What is claimed is:

1. A method of manufacturing a film, comprising:
a manufacturing step of forming a film by performing movement, in a state in which a blade surface of a coating blade disposed to be spaced so as to face a substrate surface of a substrate is in contact with a solution for forming a film which is provided between the blade surface and the substrate surface, in a first direction in a plane parallel to the substrate surface,
wherein the solution is stored in a liquid reservoir between the blade surface and the substrate surface, and at least a portion of an outer peripheral end portion of the coating blade which is in contact with the solution is tilted with respect to the first direction in a plane parallel to the substrate surface,
wherein the coating blade includes a plurality of tilted portions tilted with respect to the first direction in the plane parallel to the substrate surface, and in the manufacturing step of forming a film, the film is formed by the tilted portion having a minimum tilt angle among the plurality of tilted portions,
wherein the solution is a solution including a material having aligning properties, and
wherein an alignment direction of an alignment film formed with the solution by moving, in the first direction, a rectangular blade member that is parallel to the plane parallel to the substrate surface and that has a side elongating in a second direction orthogonal to the first direction is different from an alignment direction of the film formed with the solution.

2. The method of manufacturing a film according to claim 1,
wherein a tilt angle of at least the tilted portion having a minimum tilt angle among the plurality of tilted portions is 45° or less.

3. The method of manufacturing a film according to claim 1,
wherein, in the manufacturing step of forming a film, the solution is continuously supplied to a portion between the blade surface and the substrate surface.

4. The method of manufacturing a film according to claim 1,
wherein in a region in which the blade surface is in contact with the solution, a minimum distance between the blade surface and the substrate surface is 100 μm or less.

5. The method of manufacturing a film according to claim 1,
wherein a surface of the coating blade is tilted with respect to at least one direction of the first direction, a second direction that is parallel to the plane parallel to the substrate surface and is orthogonal to the first direction, or a third direction that is orthogonal to the plane parallel to the substrate surface and the first direction.

6. The method of manufacturing a film according to claim 1,
wherein a moving speed of the blade surface of the coating blade is 50 mm/min or faster.

7. The method of manufacturing a film according to claim 1,
wherein the manufacturing step of forming a film by disposing the plurality of the coating blades in a second direction parallel to the plane parallel to the substrate surface and orthogonal to the first direction is performed.

8. The method of manufacturing a film according to claim 1,
wherein the manufacturing step of forming a film by disposing the plurality of the coating blades in a second direction parallel to the plane parallel to the substrate surface and orthogonal to the first direction, and supplying different solutions for each of the coating blades to the plurality of the coating blades is performed.

9. The method of manufacturing a film according to claim 1,
wherein the solution including a material having aligning properties is a solution including a material for forming a crystal or a solution including an organic semiconductor.

* * * * *